United States Patent
Irons

(10) Patent No.: US 12,013,731 B2
(45) Date of Patent: Jun. 18, 2024

(54) PHASE BALANCING CONTROL SYSTEM FOR NETWORK DATA CENTERS

(71) Applicant: Edwin Travis Irons, Reno, NV (US)

(72) Inventor: Edwin Travis Irons, Reno, NV (US)

(*) Notice: Subject to any disclaimer, the term of this patent is extended or adjusted under 35 U.S.C. 154(b) by 407 days.

(21) Appl. No.: 17/460,692

(22) Filed: Aug. 30, 2021

(65) Prior Publication Data

US 2021/0389810 A1 Dec. 16, 2021

Related U.S. Application Data

(63) Continuation-in-part of application No. 16/984,825, filed on Aug. 4, 2020, now abandoned.

(60) Provisional application No. 62/974,161, filed on Nov. 18, 2019.

(51) Int. Cl.
*G06F 1/18* (2006.01)
*G06F 1/26* (2006.01)
*H04L 12/10* (2006.01)
*H05K 7/14* (2006.01)

(52) U.S. Cl.
CPC .............. *G06F 1/189* (2013.01); *G06F 1/263* (2013.01); *H04L 12/10* (2013.01); *H05K 7/1492* (2013.01)

(58) Field of Classification Search
CPC ....................................................... G06F 1/189
USPC .......................................................... 307/53
See application file for complete search history.

(56) References Cited

U.S. PATENT DOCUMENTS

| | | | |
|---|---|---|---|
| 7,282,921 B2 | 10/2007 | Sela et al. | |
| 8,053,926 B2 | 11/2011 | Lehmann et al. | |
| 8,107,225 B2 | 1/2012 | Rasmussen et al. | |
| 8,621,248 B1 | 12/2013 | Weber et al. | |
| 9,583,936 B1 | 2/2017 | Wishman et al. | |
| 11,048,311 B1 * | 6/2021 | Churnock | G06F 1/28 |
| 2011/0046808 A1 | 2/2011 | Kellis et al. | |
| 2015/0113295 A1 | 4/2015 | Mohr et al. | |
| 2016/0164291 A1 | 6/2016 | Rosendahl | |
| 2016/0225562 A1 | 8/2016 | Franks et al. | |
| 2016/0261112 A1 | 9/2016 | Teroerde et al. | |
| 2018/0159364 A1 | 6/2018 | Wu et al. | |

(Continued)

OTHER PUBLICATIONS

International Search Report issued in International Application No. PCT/US2020/060873 dated Mar. 31, 2021.

(Continued)

*Primary Examiner* — Joseph Chang
(74) *Attorney, Agent, or Firm* — United IP Counselors, LLC

(57) ABSTRACT

In a network data center, a plurality of modules provide power to equipment racks. Each of the modules has a plurality of taps which are connected by internal switching elements to power mains through an internal power distribution bus, such that each of the modules can switch any of the plurality of taps to two of the three phases of power. Each of the equipment racks has a multi-branch power distribution unit, branches of which may be connected together to receive power from the same tap. The number of branches in each multi-branch power distribution unit is configurable to adapt to the power requirements of the equipment rack. Power and control signals for the logic and control circuits of the modules are supplied separately from the power mains by a coordinating computer which has the modules connected in a redundant ring topology.

13 Claims, 18 Drawing Sheets

(56) References Cited

U.S. PATENT DOCUMENTS

2021/0076529 A1* 3/2021 Pachoud ............ G06F 11/3058

OTHER PUBLICATIONS

Written Opinion issued in International Application No. PCT/US2020/060873 dated Mar. 31, 2021.

* cited by examiner

PHASE BALANCING CONTROL SYSTEM FOR NETWORK DATA CENTERS

CROSS-REFERENCE TO RELATED APPLICATIONS

This application is a continuation-in-part of U.S. patent application Ser. No. 16/984,825, filed Aug. 4, 2020, which claims priority to U.S. Provisional Patent Application No. 62/974,161, filed Nov. 18, 2019, the contents of which are incorporated by reference in their entirety.

TECHNICAL FIELD

The present disclosure is directed to internet data centers, and in certain more particular applications, to the power distribution, power monitoring systems, and circuit protection architecture within.

BACKGROUND

Data centers are the central component of the internet, places where computers, networking, and telecommunications equipment are housed and maintained. Typical data centers contain numerous racks of computational equipment that require power, cooling, and connections to communications facilities. The equipment racks are typically arranged in rows separated by aisles that allow human access to the front and rear of the racks for installation, configuration, and service of the computational equipment housed within. Computational equipment in data centers is ideally expected to operate 24 hours a day, seven days a week, with no interruption in service. One component to achieving this goal is preventing power overloads that result in fault protection devices activating and interrupting power to the equipment.

It is common that alternating three-phase power is distributed throughout the data center to each rack in a three-phase delta or three-phase wye configuration. It is common that there is power distribution equipment at each rack that distributes the three-phase power to single-phase power. It is common that the computational equipment in the rack requires single phase alternating current power to operate.

It is desirable to utilize the three phases of power from the utility as equally as possible, often referred to as phase balancing. Utilizing the three phases equally results in the most efficient usage of power, as it minimizes current in the neutral wire of a three-phase wye system and allows for maximum utilization of the available power in a three-phase delta system, among other benefits. Situations where the phases are not utilized equally such that all of the available power can be utilized are often referred to as stranded capacity.

A common method of distributing three-phase power to a plurality of racks oriented in a linear row is by using a plurality of electrical conductors running parallel and in close proximity to the linearly oriented row of racks. It is common that the parallel electrical conductors originate from an upstream distribution panel often placed near the end of each row of racks. At each rack, one or more power distribution devices connects to the parallel electrical conductors and distributes the three-phase power to single phases or single-phase pairs for delivery to the computational equipment. Another common method of distributing three phase power to a plurality of racks oriented in a linear row is by running dedicated cabling to each rack from a power distribution panel.

Phase balancing is accomplished in a data center by manually connecting the computational equipment to the three phases or phase pairs as equally as possible. This method is not ideal, as the power draw from the computational equipment varies over time in response to demand. Additionally, computational equipment is added, removed, and changed on a daily basis within a data center, which introduces challenges in keeping the phases equally utilized, as the newer equipment may have different power usage characteristics.

In the power path from the upstream distribution panel to the computational equipment in the rack, there are a plurality of circuit protection devices housed within the three phase to single phase power distribution equipment, typically circuit breakers or fuses. It is common that a plurality of computational equipment units is connected to a single circuit protection device.

When a circuit protection device activates, or opens, due to an over current condition, it is often referred to as tripped circuit. A tripped circuit interrupts the flow of power.

Circuit protection devices exist in an electrical system in order to prevent damage to the equipment and increase the safety for humans working on or in proximity to the electrical equipment.

A common cause for a circuit protection device to activate is an excess amount of current being drawn by the computational equipment in the rack due to an increasingly high demand of work being placed on the computational equipment.

Another common cause for a circuit protection device to activate is a short duration surge of current due to a fault in the computational equipment creating a short circuit condition. It is common for a short circuit fault within the computational equipment to activate internal circuit protection devices, usually fuses, that interrupt the fault. In the case where fuses internal to the computational equipment open, the computational equipment will no longer operate, nor will it cause a short circuit condition.

The typical fuse-type circuit protection device used in data center power distribution equipment is not resettable, so must be replaced by a human in the event it activates or trips.

The typical circuit breaker-type circuit protection devices used in a data center is not remotely resettable, so must be reset by a human in the event it activates or trips.

As it is desirable to keep the computational equipment running 24 hours, seven days a week, a circuit protection activation event, commonly referred to as a tripped circuit, is undesirable because it requires a human to locate the tripped device and correct it by replacing a fuse or resetting a circuit breaker.

It is common for the power distribution equipment in the data center to contain monitoring circuitry for collecting metrics such voltage and current. These metrics are used by data center managers for a variety of purposes, including avoiding overload conditions that can cause service interruptions, balancing of phases, and verifying the equipment is operating within typical parameters. It is also common for the power distribution equipment to contain circuitry allowing the power to the computation equipment to be remotely disconnected and reconnected by means of a relay. The need to disconnect power from a computer may be required to reboot it if it becomes non-responsive, often referred to as crashed or locked up. The disconnect-reconnect function may also be required when performing software upgrades. The disconnect ability would also allow a data center manager to remotely shut down equipment in case of a cooling system failure, which would prevent damage to the computers due to thermal overloads. This type of power distribution equipment is generally connected to a network, allowing remote monitoring and control, and is often referred to as "intelligent."

The monitoring and control circuitry within the intelligent power distribution equipment requires direct current (DC) power to operate. To generate DC power for the monitoring and control circuitry, a single on-board AC to DC power supply is used. However, a single power supply has no redundancy in case of a failure, which could pose problems in keeping the data center operating continuously.

Typical intelligent power distribution units utilize Ethernet cabling to connect to a network. Ethernet does not provide any functional awareness of physical location of a device within the network. This requires additional setup steps to configure the power distribution device with location information.

Internet data centers are ever changing environments, constantly adapting to meet the computational demands of the day. As the computational capacity changes, so do the power requirements. It is common upon deployment of a new data center that all racks are not filled to capacity; large portions of the racks are left empty. Over time as demand increases, computers are added to meet the growing demands. Additionally, as computers evolve, their power requirements change. Computers in data centers are retired typically within three to five years, to be replaced by higher power, more efficient machines. The lifetime of intelligent power distribution equipment is in the ten to fifteen-year range, so it must be planned to meet the changing demands of the computational equipment it feeds. Yet it is very difficult to know what the next generation of computers will require for power, and conventional intelligent power distribution equipment does not have the ability to scale for different power demands. Thus, data center managers often deploy very large-capacity power distribution equipment in order to plan for the worst case. This "worst case" approach is wasteful of resources and increases the up-front costs of starting or upgrading a data center.

BRIEF SUMMARY

Embodiments of the invention described herein reduce the occurrences of a power interruption due to over-current and short-circuit conditions and provide for automatic phase balancing of the data center.

In one embodiment, the system monitors the total current being utilized in a plurality of racks, often oriented in a row, connected to a common distribution point, often placed near the end of the row. The system also monitors the current flowing on each branch circuit that supplies power to the computational equipment in the equipment rack. The system has the ability to switch the current being delivered to the equipment between phases or phase pairs for purposes of balancing the utilization from each phase and preventing overloads. The system has the ability to interrupt the current being delivered to the equipment in the rack. The system has the ability to detect if the equipment in the rack is short circuited due to an internal fault.

The system monitors the usage on each phase and selectively switches loads between phases to achieve phase balancing. The phase balancing system may be configured to automatically switch phases to achieve balance, or it may be configured to send a notification to a data center operator who can remotely switch phases.

If the system detects an over-current condition approaching on one of the phases or phase pairs being delivered to a plurality of racks connected to a common distribution point, it selectively switches one or more circuits at one or more of the rack distribution points, from the overloaded phase or phase pair to a less utilized phase or phase pair.

If the system detects an imminent overcurrent condition at the delivery point to the computational equipment that could potentially activate a circuit protection device, commonly a circuit breaker or fuse, it interrupts the current by means of opening a relay or switch prior to the circuit protection device activating. After interrupting the current, the system notifies data center operators or systems of the event. Restoring power to the equipment can then be remotely activated when the demand on the equipment has been reduced such that it would not draw an excess amount of current and cause the circuit protection device to activate.

If the system detects a short duration surge of current that could potentially activate a circuit protection device at the rack distribution point, it interrupts the current by means of opening a relay or switch prior to the circuit protection device activating. It then periodically checks if there is a short circuit in the computational equipment by means of an ohm meter. If it does not detect a short circuit, it automatically restores power by closing the relay. As there is typically more than one computational device on each circuit, those computational devices that are operable are able to return to service.

The topology of the system is such that it minimizes the space consumed in the data center equipment rack. Traditional power distribution equipment, often referred to as intelligent power strips or power distribution units, typically sit inside the equipment rack. The space that is consumed by traditional power strips reduces airflow needed for cooling the computational equipment, and often impedes removal and replacement of the computational equipment or the modular components within the computational equipment such as power supplies and network interface cards.

The topology of the system places the majority of components of the power distribution system outside of the rack, thus allowing the deployment of a smaller rack. This reduces the footprint of the rack and allows for more racks to fit in a given space, thus increasing the computational power and efficiency of the data center.

Traditional intelligent power strips each contain an independent control system, user interface, and AC to DC power supply. These components occupy a significant volume and add cost to the device. The topology of the system according to aspects of the invention has a centralized redundant power supply system and a centralized redundant control system able to power many tens of racks, significantly reducing the total system cost and size compared to traditional system topologies.

One particular aspect of the invention relates to a power distribution system for a data center. The power distribution system includes a number of modules. Each module connects to a set of power mains, the power mains providing more than one phase of power. The module has an internal power distribution bus, one or more power taps, and one or more internal switches that allow the one or more power taps to be switched between phases of power. The module receives power for its internal logic and control circuits from an external source separate from the power mains. The external source may be one or more individual power supplies that are redundant to one another. In one embodiment, power for the internal logic and control circuits may be supplied as DC power by the redundant power supplies of an external coordinating computer, which also provides instructions to the module and receives power metrics from the module.

Another aspect of the invention relates to systems and methods for coordinating the actions of a number of modules. In an embodiment according to this aspect of the invention, a coordinating computer connects to a number of modules in a ring topology. Power and commands are sent in both directions along the ring, so that a single break in the cables will not affect the transmissions.

In some embodiments, commands from the coordinating computer are broadcast to all connected modules. However, in certain circumstances, the coordinating computer may instruct the connected modules to enter into a relay mode, in which data or commands are relayed from one module to the next. A relay mode may be used, for example, to automatically construct a physical map of the connected modules and to assign identifiers to each connected module. In this case, a data packet with a blank map is circulated, and as each module receives it, it assigns itself an identifier and writes that identifier to the map in the appropriate location before forwarding the altered data packet.

Other aspects, features, and advantages of the invention will be set forth in the description that follows.

BRIEF DESCRIPTION OF THE DRAWING FIGURES

The invention will be described with respect to the following drawing figures, in which like numerals represent like features throughout the description, and in which.

DETAILED DESCRIPTION

Figure 1:
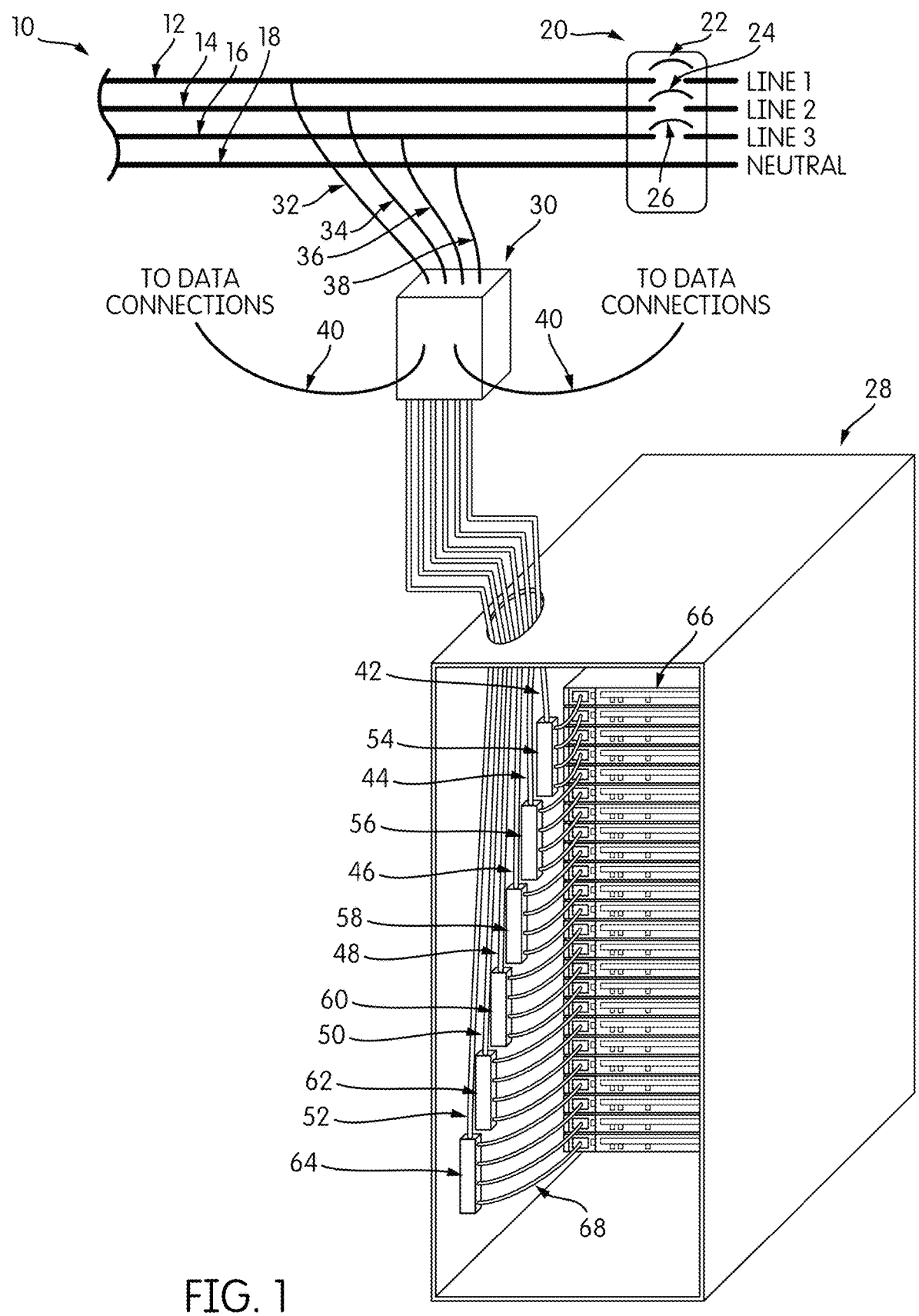
FIG. 1 is a schematic illustration of an equipment rack in a data center, shown as connected to a power overload control system according to an embodiment of the invention.

FIG. 1 illustrates a power delivery system, generally indicated at 10, according to one embodiment of the invention. In power delivery system 10, power delivery bus lines 12, 14, 16, 18 are the power delivery bus lines for a three-phase wye electrical system and have the capacity to supply a plurality of equipment racks containing a plurality of computational devices. An end-of-row distribution point 20 contains circuit protection devices 22, 24, and 26, one on each of the three phase lines 12, 14, 16. (The neutral line 18 has no circuit protection device of its own.) An equipment rack 28 is connected to the power delivery bus lines 12, 14, 16, 18 through a power overload control system, which is generally indicated at 30.

More specifically, power is delivered from the power delivery bus lines 12, 14, 16, 18 via connecting cables 32, 34, 36, 38, to the power overload control system 30, which is shown as a single module in the view of FIG. 1, although, as will be described below, it may take the form of multiple, interconnected modules. System module 30 receives data and power for its local control system through connection cables 40, although these could be wireless or optical interconnections, for example, that are not physically visible. Single phase power is delivered into the rack 28 by interconnecting cables 42, 44, 46, 48, 50, 52 to outlet strips 54, 56, 58, 60, 62, 64. Single phase power is delivered to the computational equipment 66 by interconnecting cables 68.

Although FIG. 1 shows the system module 30 distributing six lines of power 42, 44, 46, 48, 50, 52, commonly referred to as branch circuits, into the rack 28, this is for illustration only, as the number of branch circuits can vary depending on the application, and would typically increase as the total potential power requirement of the computational equipment 66 increases. Additionally, although FIG. 1 shows the six outlet strips 54, 56, 58, 60, 62, 64 within the rack having four outlets each, it should be noted that the number of outlets in each outlet strip can vary by number and type depending on the requirements of the computational equipment.

Figure 2:
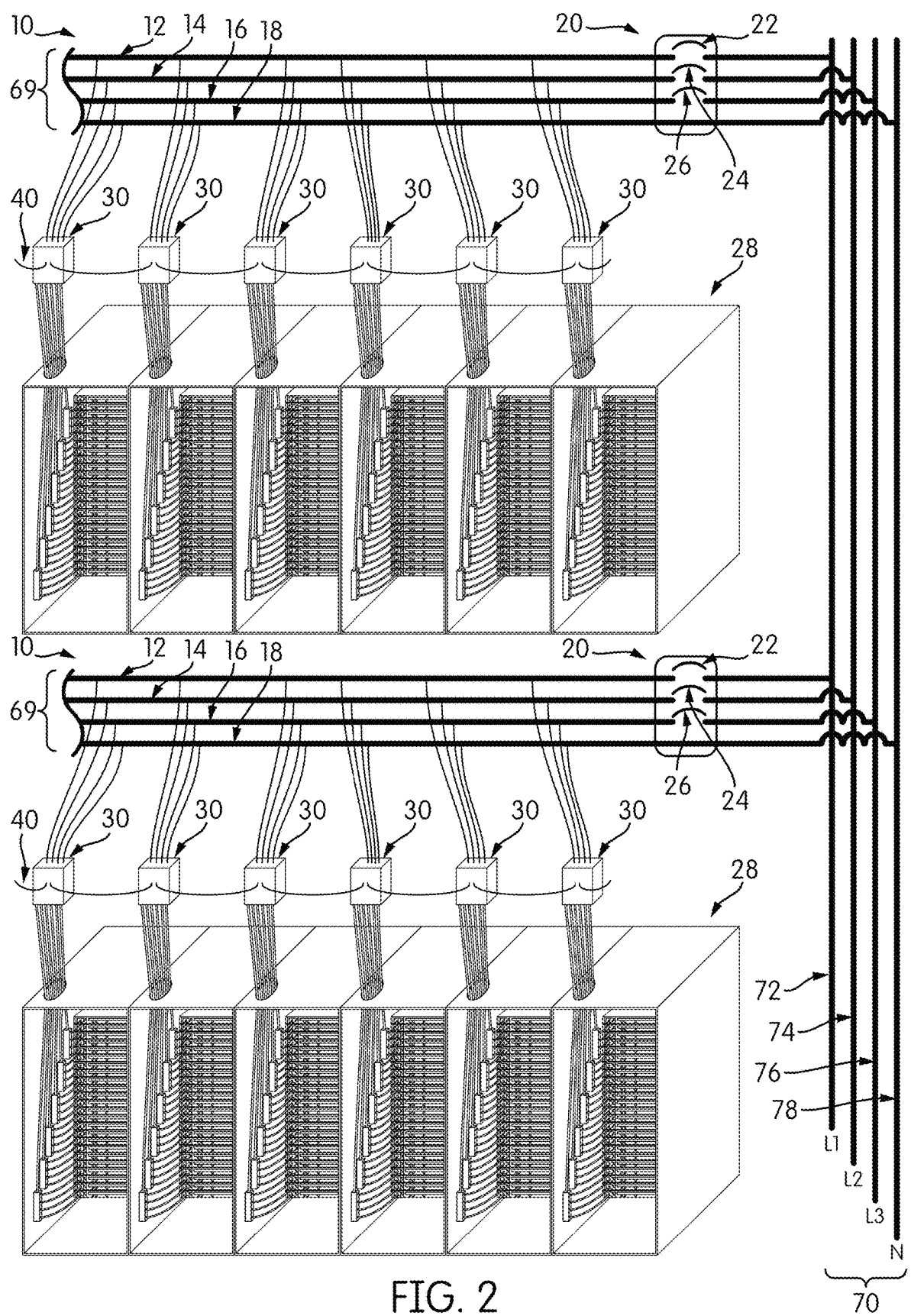
FIG. 2 is a schematic illustration of two rows of data center equipment racks, showing how the system of FIG. 1 is connected to each.

FIG. 2 illustrates two rows of data center equipment racks 28. Each row of equipment racks is supplied power from a three-phase wye electrical busway 69 with lines 12, 14, 16, 18, that is in turn connected to a higher-capacity bus way 70 with lines 72, 74, 76, 78 shown running perpendicular to the rows of equipment racks. Circuit protection devices 22, 24, 26 lie at the intersection between the two bus ways 69, 70. System modules 30 are connected between each of the smaller bus ways 69 and the equipment racks 28. Each system module 30 is interconnected by a data communication bus 40, as was described briefly above. Although FIG.

2 shows two rows of six equipment racks 28 supplied by two power distribution points 20, it should be noted that the number of rows, racks, and distribution points can vary depending on the requirements of the data center.

Figure 3:
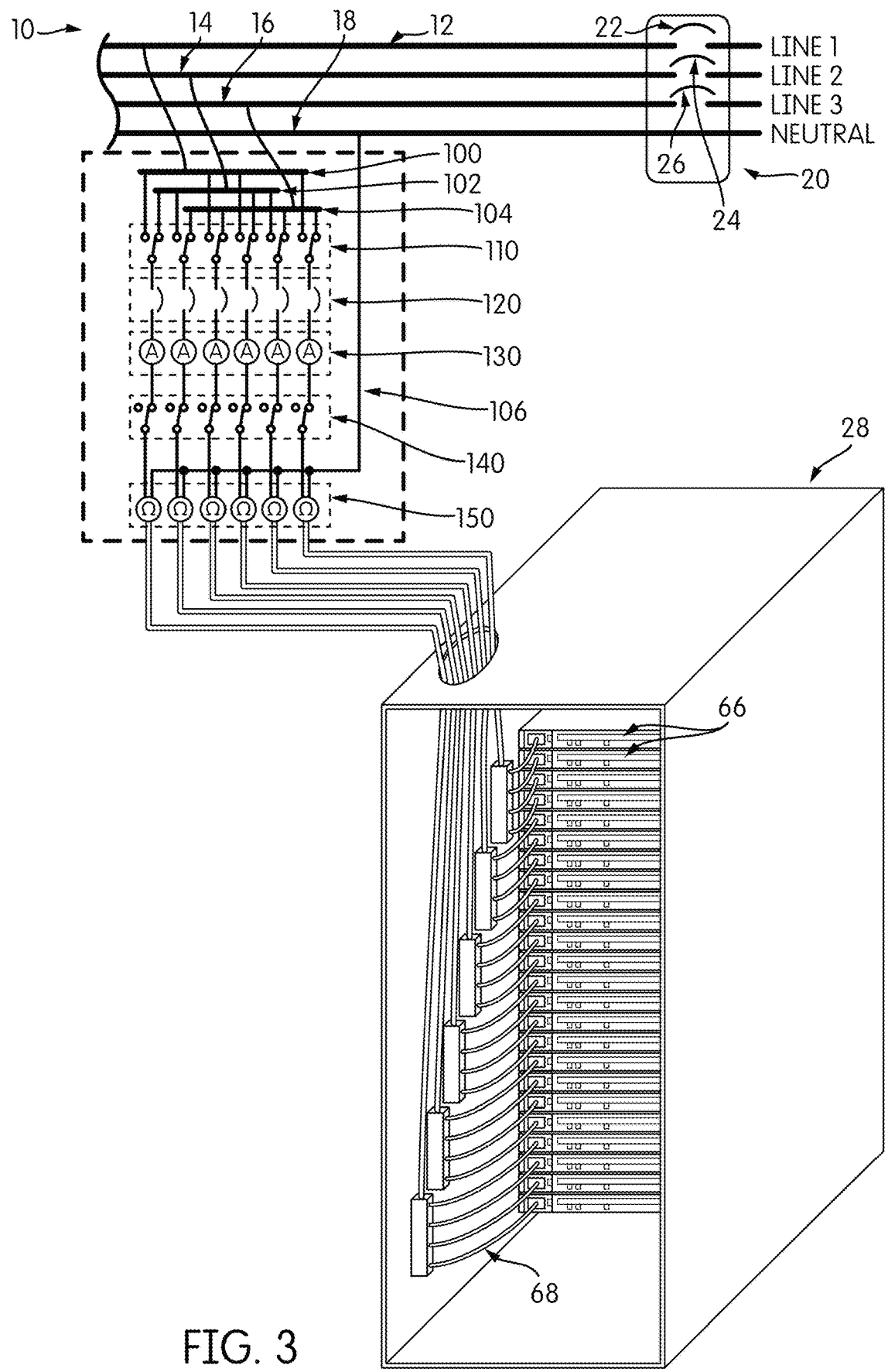
FIG. 3 is a schematic illustration similar to the view of FIG. 1, with a more detailed diagram of the components of the system of FIG. 1.

FIG. 3 is a schematic illustration similar to FIG. 1, including a more detailed diagram of a system module 30. Internal to the module 30 are distribution buses for the first phase, the second phase, and the third phase, which include a first phase line 100, a second phase line 102, and a third phase line 104. The Neutral wire of the three-phase wye system is shown at 106. Below the distribution buses are the phase selection relays or switches 110. The phase selection relays 110 allow one of two phases to be selected for delivery to the computational equipment 66. The two phases that are available for each delivery line to the computational equipment 66 are distributed evenly through the system module 30. More specifically, as can be seen in FIG. 3, the left most relay 110 is connected to phase lines 100 and 102, the next relay 110 is connected to phase lines 102, and 104, the next relay 110 over is connected to phase lines 104 and 100, etc. The precise phase lines 100, 102, 104 to which any particular relay 110 is connected is not critical so long as the relays 110 are arranged so that as a whole, there is an integral ratio of relays 110 to phases, for example two-to-one as shown. Increasing the ratio of relays 110 to phases to a three-to-one or four-to-one ratio increases the granularity, and improves the probability that a balanced condition can be obtained. It should be noted the centralized controller, described in more detail below, not only attempts to achieve balanced phase utilization at each rack, but also, and more advantageously, it attempts to achieve balanced phase utilization across all racks and the entire data center itself.

Although the symbol used in FIG. 3 is that of a relay, the switching device may be of a different type, for example, a rotary switch, a linear switch, a toggle switch, or a custom-design current-routing apparatus. The device used as a relay 110 should be capable of accepting the voltages that are typical during use and, as will be described below in more detail, it should be capable of automatic control. For example, in a North American installation, a relay 110 should be capable of handling 415 VAC and, more advantageously, rated to handle higher voltages as required by safety regulations and good electrical practice. A voltage rating of 480 VAC, for example, may be desirable in at least some embodiments.

As those of skill in the art will appreciate, in some cases, it may be possible or desirable to pair a switching apparatus that does not have automatic control capabilities with an apparatus to provide such control. For example, a conventional rotary switch may be paired with a stepper motor, or another type of electrically-controlled driving apparatus, to make a switch 110 suitable for use in the system module 30.

Connected to the outputs of the relays 110 are fault protection devices 120, typically circuit breakers or fuses of an appropriate size and capacity as required by safety regulations and good electrical practice. Ammeters 130 are used to monitor the current on each line. The system module 30 also includes circuit interruption relays or switches 140, which are used to interrupt the delivery of current to the computational equipment 66. Current interruption to the computational equipment 66 may be used to prevent the circuit breakers or fuses from tripping in the event of an overcurrent or short circuit condition. Additionally, the circuit interruption relays or switches 140 may be used to remove the power load of the computational equipment 66 from the circuit prior to the phase selection relays or switches 110 being activated. Removing the power load of the computational equipment 66 prior to actuating the phase selection relays or switches 110 may reduce arcing in the relays 110.

Ohmmeters 150 are used to detect if one or more pieces of the computational equipment 66 connected to that branch circuit are short circuited.

Although FIG. 3 shows the system module 30 with six branches or circuits of single phase power being delivered into the equipment rack 28, this is for illustration only, as the number of branches can vary depending on the application, and would typically increase as the total potential power requirement of the computational equipment increases.

Figure 4:
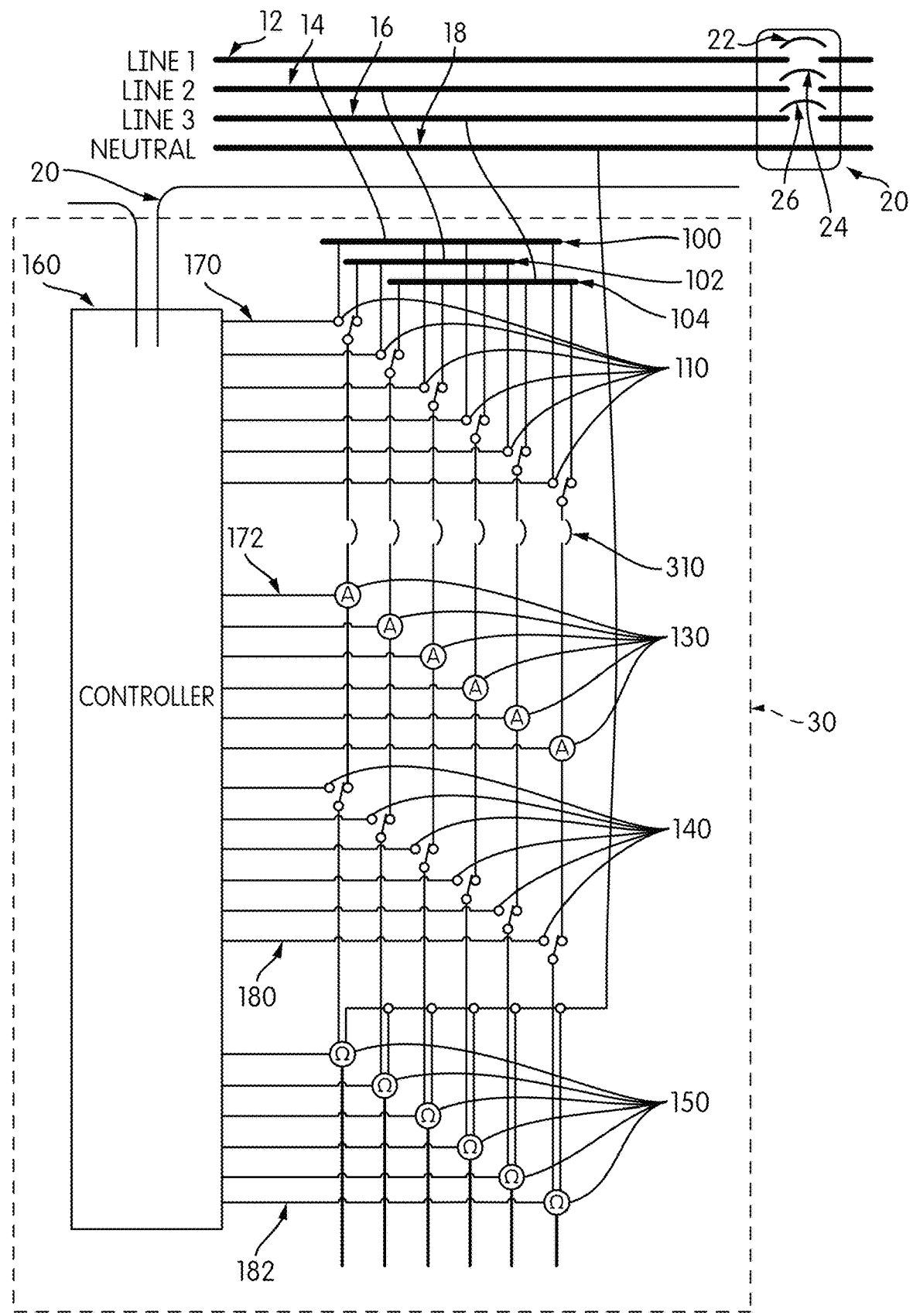
FIG. 4 is a detailed schematic illustration showing the connections of the system with the monitoring and control components.

FIG. 4 is a more detailed version of FIG. 3, showing some of the interconnections of the system module with each of the monitoring and control components. The controller 160 contains the necessary circuitry to intelligently monitor and control the system, including but not limited to microprocessors, memory, communications systems, and related software. While the term "microprocessor" is used here for ease of description, any component capable of performing the functions ascribed to it in this description may be used, including, for example, microcontrollers, field-programmable gate arrays (FPGAs) and application-specific integrated circuits (ASICs).

The controller 160 controls the position of each phase selection relay or switch 110 by means of a control line 170. The controller 160 monitors the current on each circuit by means of connections 172 to the ammeters 130. The controller 160 controls the circuit interruption relays or switches 140 by means of control lines 180. The controller 160 reads the resistance at the output of the circuits as measured by the ohmmeters 150 by means of connecting lines 182.

Only the major components of the circuitry are shown for purposes of describing the operation. In addition, the connecting lines between the controller 160, relays or switches 110, 140, and meters 130, 150 are for purposes of demonstrating a functional connection. The nature of the interconnections may be analog, digital, electrical, optical or wireless, as an example.

Figure 5:
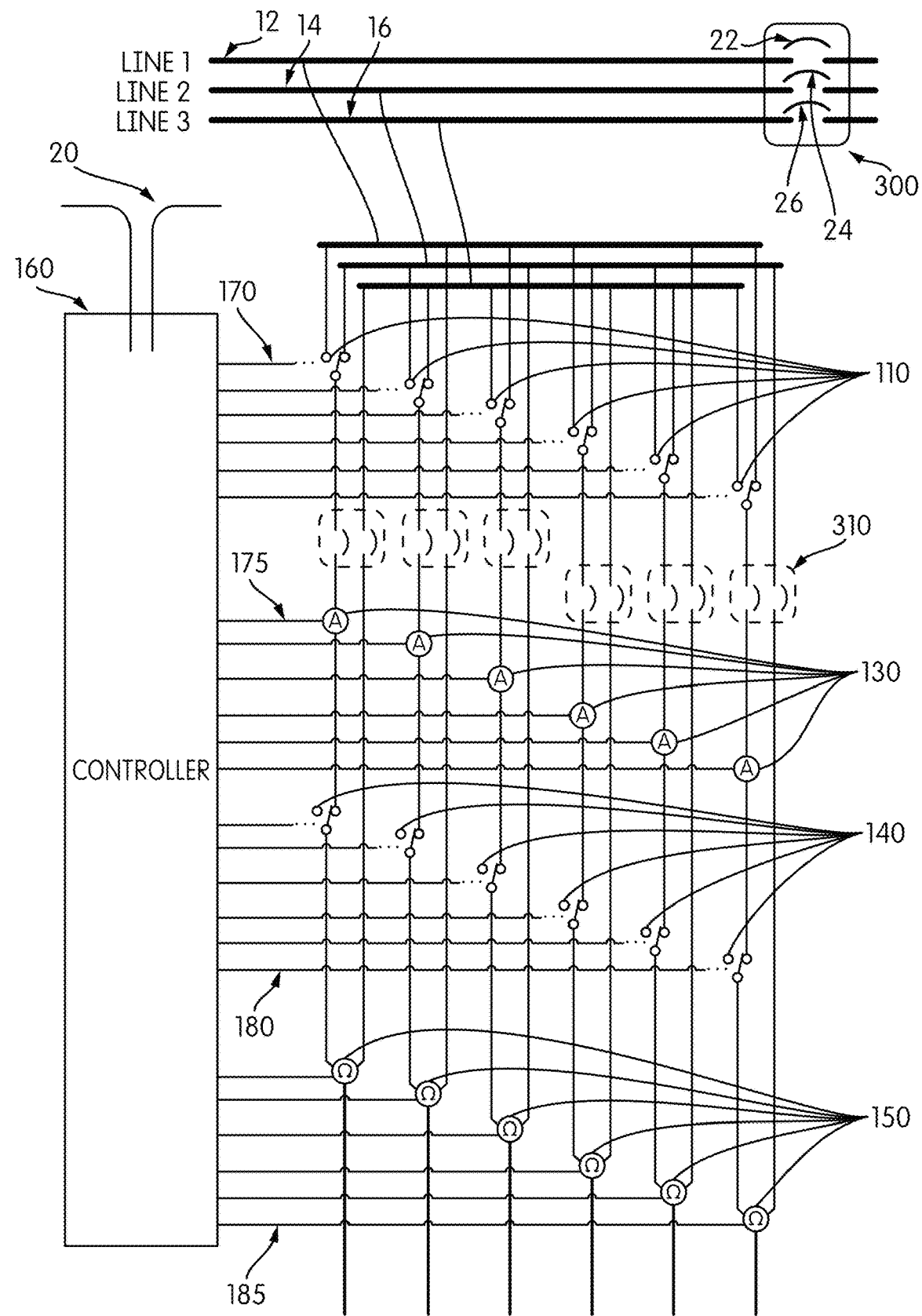
FIG. 5 is an illustration of an alternate embodiment in which three-phase delta power is distributed into single-phase pairs for delivery into the rack.

FIG. 5 illustrates an embodiment of a system module 300 configured for a three-phase delta power system. In a three-phase delta system, single phase power is delivered as phase pairs, and fault protection devices 310 are two-pole type. The configuration is otherwise essentially the same as the configuration of FIG. 4.

Figure 6:
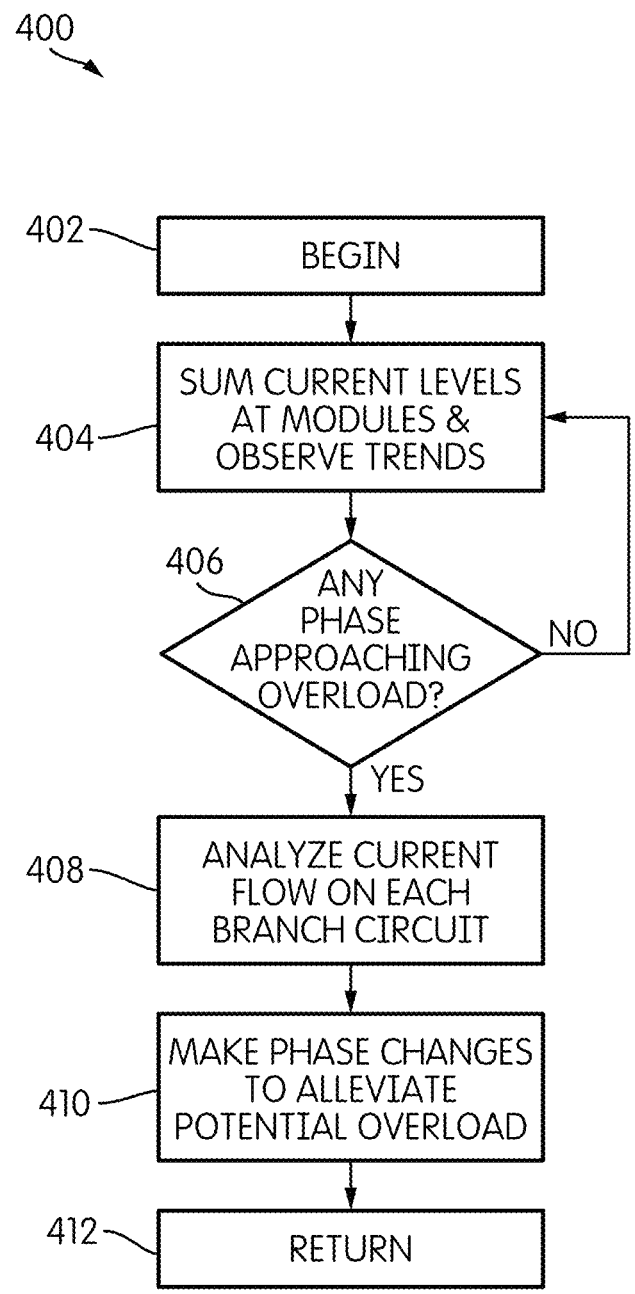
FIG. 6 is a flow diagram of a method for using the system of FIG. 1 to automatically manage phase balancing.

FIG. 6 is a flow diagram of a method, generally indicated at 400, for controlling the system modules 30 and managing the draw on any one phase of power in order to prevent overload. The software for performing this function may be contained in each of the system modules 30, or it may be contained in a master controller, which will be described below in more detail.

Method 400 begins at 402 and continues with task 404. In task 404, the controller 160 sums the current levels on each phase at each module 30. This would usually involve using the ammeter 130 on each phase-line to measure and calculate root mean square current. Typically, the current usage trend on each branch circuit is observed over some period of time, and when a measurement is taken in task 404, the trends are updated with the latest usage values.

In a typical embodiment, the controller 160 is pre programmed with a threshold that, if exceeded, is likely to cause the circuit protection devices 22, 24, 26 to trip. This threshold is directly related to the current rating of circuit protection devices 22, 24, 26, and may include information about the trip curves of those devices. For example, the controller 160 may be programmed with the maximum current values for the circuit protection devices 22, 24, 26 (i.e., the amperages at which the circuit protection devices 22, 24, 26 will trip), and sufficient information about the topology of the system or number of controllers 160 in operation for the controller 160 to have an idea of the current draw for its module 30 for each phase relative to the total current draw on each phase.

Method 400 continues with task 406, a decision task. If the current draw on any phase is at or has exceeded the threshold, or is imminently likely to reach and exceed the threshold as determined by trend data (task 406:YES), control passes to task 408. In determining whether the current draw is likely to exceed the threshold, the controller 160 may take into account the current consumption historical trend and project that, based on, e.g., a simple slope or time derivative of the curve, the current draw on a particular phase is likely to exceed the threshold within a particular time horizon if unchecked. The time horizon may vary from embodiment to embodiment and installation to installation but may be, e.g., 1 second, 2 seconds, 5 seconds, etc. If the current draw on any phase is not at the threshold and is unlikely to exceed the threshold within the time horizon (task 406:NO), control of method 400 returns to task 404 and the controller 160 continues to monitor.

In task 408, the controller 160 analyzes the current flow in each branch to find a phase with an acceptably low current load for phase switching purposes. This analysis may take into account both the present (i.e., instantaneous) current draw on the phases, as well as the trend. The controller 160 may determine whether, given the present current draw trend, the addition of current load on that phase would be likely to exceed the relevant threshold. Once a suitable phase is found to which to switch some or all of the current load, method 400 continues with task 410, and the appropriate phase changes are made by triggering the appropriate relays 140. Task 410 is further propagated to all connected controllers 160 that share the electrical service downstream of circuit protection devices 22, 24, 26. This may be accomplished by the election of one of the controllers 160 in the group to be the master controller, or by a master controller contained outside of the modules 30, which will be described below in more detail. The master controller analyzes all branches in the system which would typically number in the hundreds, and directs each module 30 to make the appropriate phase changes to alleviate potential overloads, effectively balancing the three phases within that group. Once any necessary changes are made to alleviate potential overload, method 400 returns in task 412. Assuming that there are no exceptions, method 400 is likely to run continuously or nearly continuously, immediately beginning again at task 402 after it returns at task 412.

Figure 7:
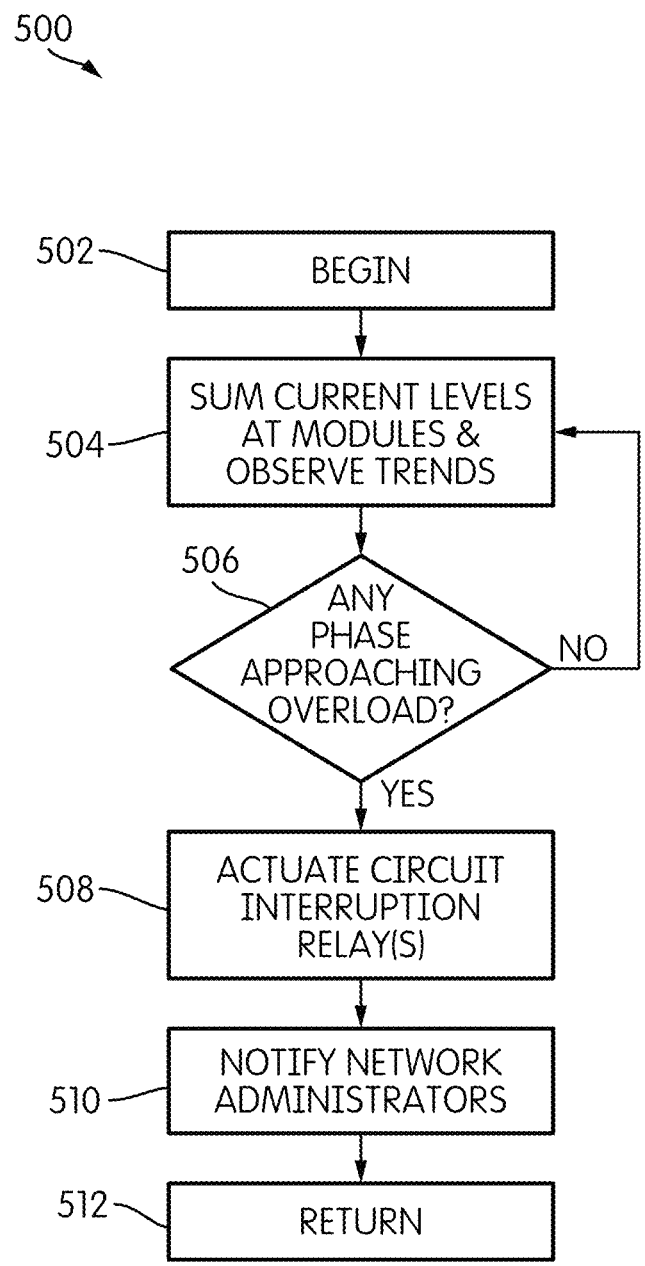
FIG. 7 is a flow diagram of a method for using the system of FIG. 1 to manage over-current conditions on the electrical branch circuits in the equipment rack.

Method 400 is but one of several methods that may run in parallel on each controller 160 or on a master controller. As was described above, it is preferable to avoid tripping the main circuit protection devices 22, 24, 26, as these must often be manually reset by facility staff. Therefore, each system module 30 includes circuit interruption relays 140 that can be actuated automatically before current draws reach levels likely to trip the main circuit protection devices 22, 24, 26. Method 500 of FIG. 7 illustrates one particular method of using these circuit interruption relays 140.

Method 500 begins at 502 and continues with task 504. Tasks 504 and 506 are similar to or the same as tasks 404 and 406 of method 400, described above. If it is determined that any particular phase is approaching an overload (task 506:YES), method 500 continues with task 508 and the appropriate circuit interruption relay 140 is actuated. Method 500 continues with task 510 and a network administrator is notified before method 500 returns at task 512. If no phase is approaching an overload condition (task 506:NO), method 500 returns to task 504 and monitoring is continued.

Task 506 of method 500 may use its own current thresholds, distinct from the thresholds used in method 400, to determine when it is appropriate to actuate a circuit interruption relay 140. In some cases, method 500 may use the same thresholds as method 400.

While methods 400 and 500 may operate independently in parallel, in some cases, the controller 160 may trigger method 500 after certain tasks of method 400. However, in other cases, methods 400 and 500 may operate in a related or a dependent way. For example, if, in task 408, no suitable phase can be found that can carry the necessary current load, a controller 160 may begin method 500 and determine whether it is necessary to actuate one of the circuit interruption relays 140.

Figure 8:
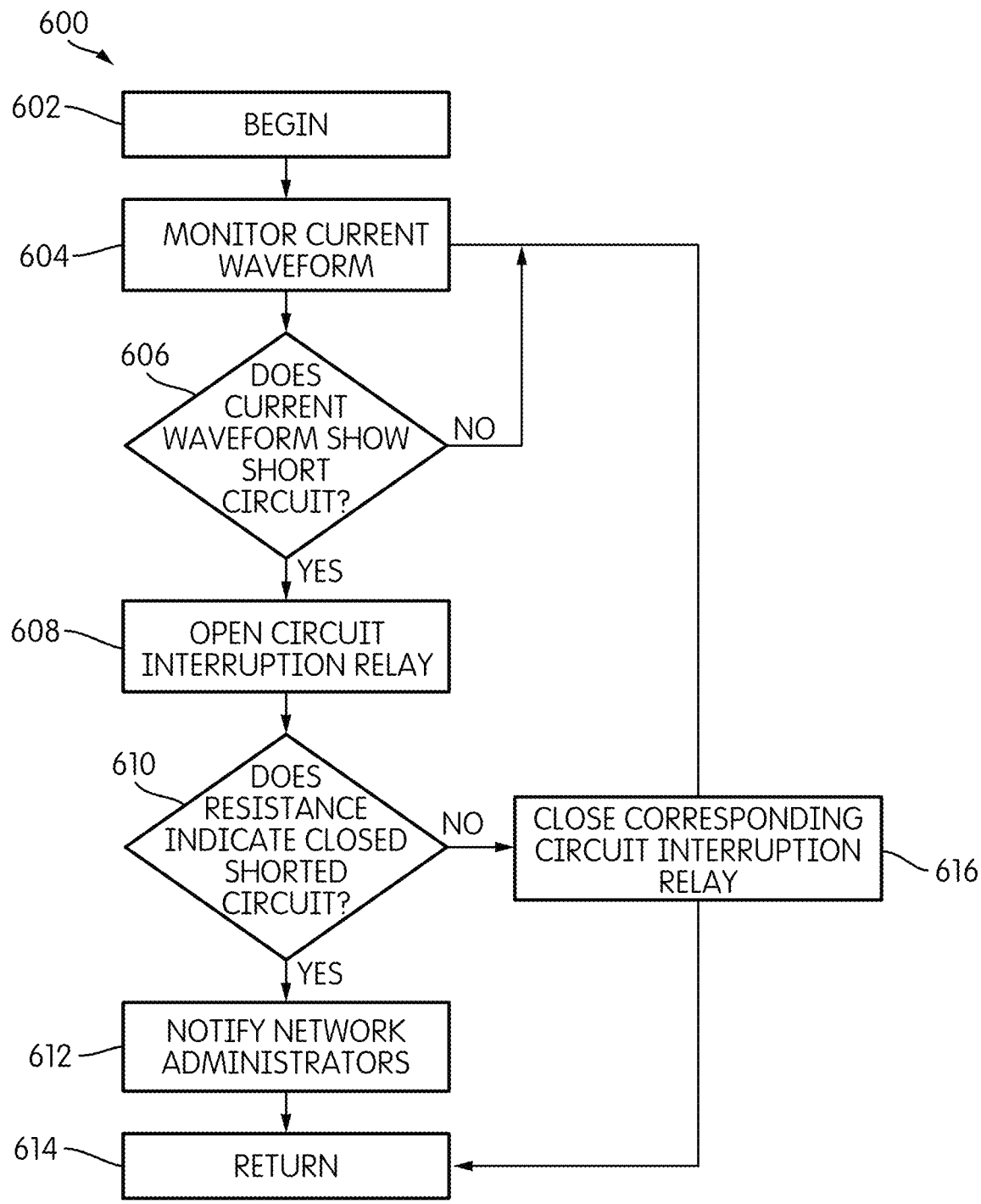
FIG. 8 is a flow diagram of a method for using the system of FIG. 1 to manage short-circuit conditions on the electrical branch circuits in the equipment rack.

FIG. 8 is a flow diagram of a method, generally indicated at 600, for managing short circuit conditions on the electrical branch circuits in the equipment rack 28. As with the other methods 400, 500 described here, method 600 may be executed on a controller 160 or a master controller. Method 600 begins at 602 and continues with task 604. In task 604, the controller 160 or master controller monitors the current waveform. The current monitored may be the full digitized waveform at a speed and granularity necessary to identify a rapidly increasing short circuit condition.

Method 604 continues with task 606, a decision task. In task 606, if the current waveform of any phase or branch exhibits the profile of a short circuit (task 606:YES), method 600 continues with task 608. If the current waveform does not exhibit the profile of a short circuit (task 606:NO), method 600 returns to task 604 and monitoring continues.

In task 608 of method 600, the controller 160 opens the circuit interruption relay 140 that corresponds to the affected branch. Method 600 continues with task 610, another decision task. In task 610, the corresponding ohmmeter 150 is read. If the resistance in the branch indicates a closed, shorted circuit (task 610:YES), method 600 continues with task 612 and network administrators are notified before method 600 returns at task 614. If in task 610, the resistance in the branch circuit does not indicate a closed, shorted circuit (task 610:NO), method 600 continues with task 616 and the corresponding circuit interruption relay 140 is closed before method 600 continues with and terminates at task 614.

In essence, method 600 deals with temporary short circuits. If one is found, the corresponding circuit interruption relay is opened. However, method 600 also checks to see whether a short circuit has cleared itself. If so, the appropriate circuit interruption relay is closed again and operations continue as normal. If the short circuit does not clear itself, network administrators are notified.

Figure 9:
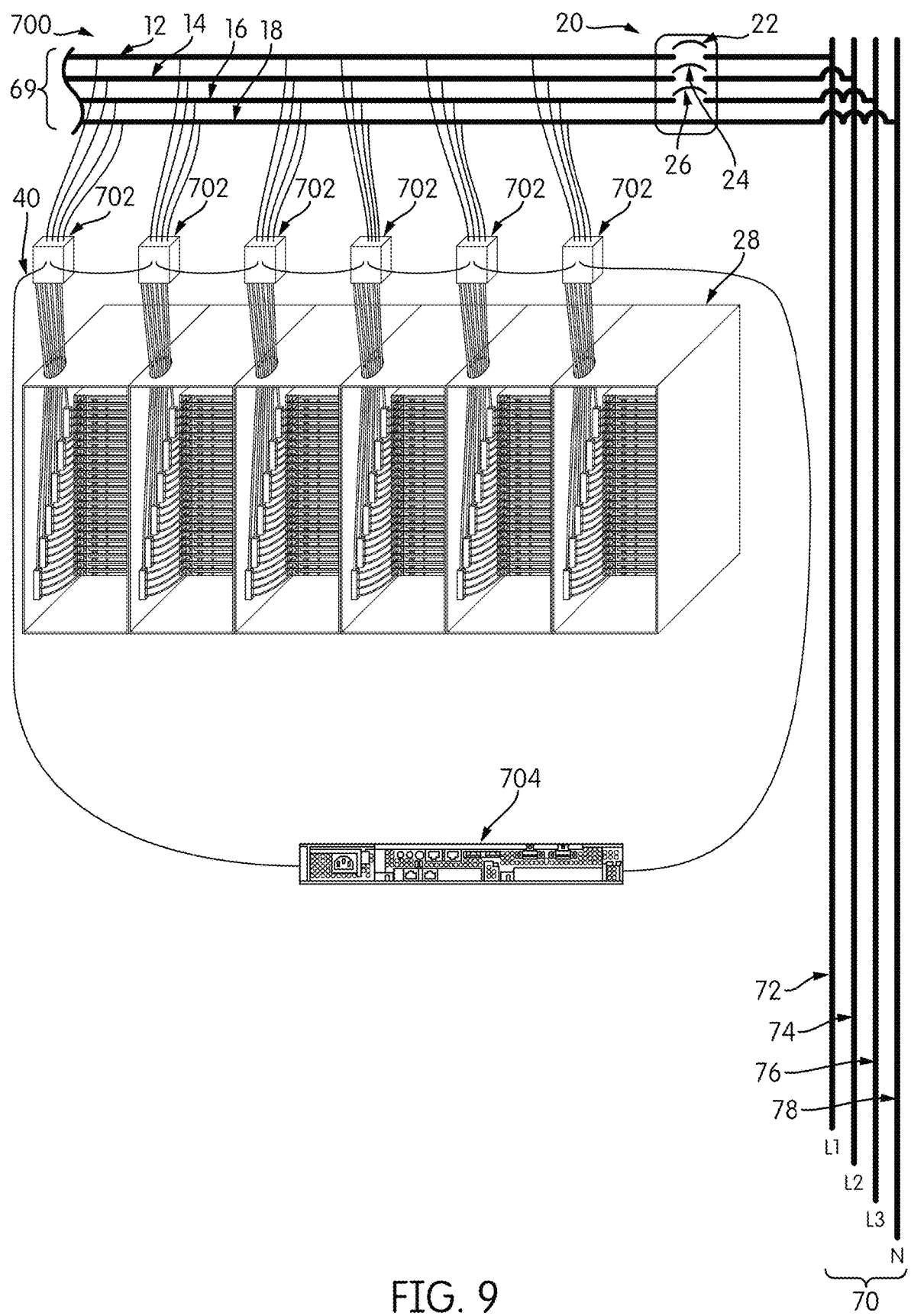
FIG. 9 is an illustration similar to FIG. 2 showing the use of a system according to an embodiment of the invention with a central controller.

FIG. 9 is an illustration of a system, generally indicated at 700, according to another embodiment of the invention. System 700 is similar to the other systems described above. In particular, a number of system modules 702 provide the functions described above to a number of equipment racks 28. In system 700, a master controller 704 is employed to manage the system modules 702, and is connected to the system modules 702 through the data bus 40. In addition to controlling each system module 702, master controller 704 may also provide DC power to each system module 702 which would be beneficial in reducing the total cost of the system, as well as the size of each system module 702. The design of the master controller 704 may also include dual power inputs for redundancy, as well as dual power and communications inputs and outputs for redundancy. FIG. 9 shows a hard-wired wiring topology, in which the connections from the master controller 704 to the system modules 702 enter on each end of the chain of system modules 702. This provides the feature that if the cabling had a fault, such as a loose connection or break, communication to the system modules 100 would not be lost, as there is a secondary communication path. Although a hard-wired connection is shown for communication to the system modules 702, that communication may also occur via other protocols, such as radio frequency or optical technologies.

Figure 10:
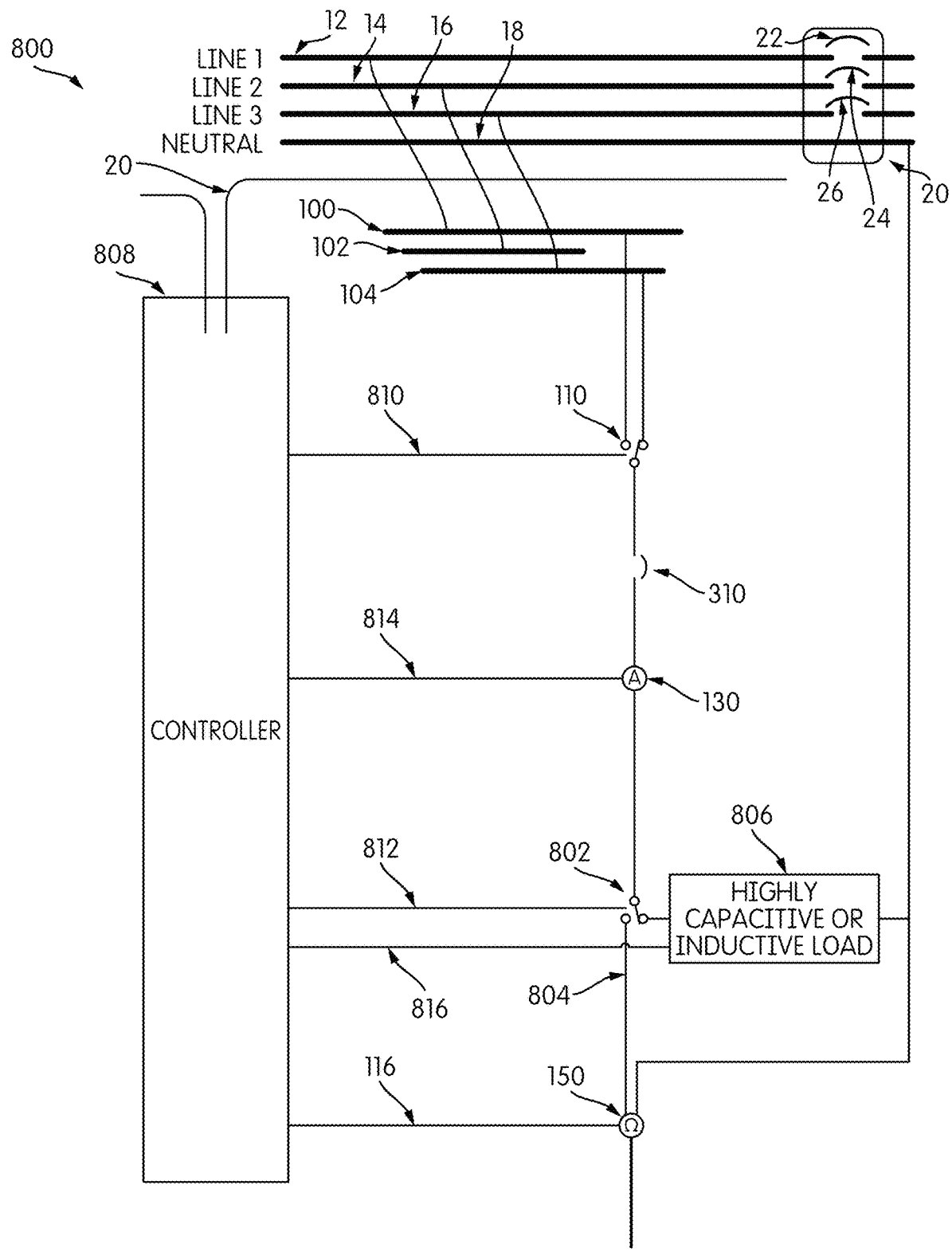
FIG. 10 is an illustration of a circuit allowing a single phase to be temporarily connected to a highly capacitive or inductive load in order to shift the phase toward the phase that the computational equipment will eventually be shifted to, in order to minimize arcing within the phase-selecting switch or relay.

As those of skill in the art will appreciate, switching equipment from one phase to another may induce electrical arcing within the relay 110 that performs the switching operation. To reduce the likelihood of arcing, or to reduce its intensity, FIG. 10 is a circuit diagram of a module 800 illustrating the circuitry that allows one of the phases to be temporarily connected to a highly capacitive or inductive load for purposes of shifting that phase closer to the phase that the computational equipment will eventually be shifted to, thus reducing arcing within the phase selecting switch or relay.

Specifically, the module 800 has a controller 808 and a distribution bus with phase lines 100, 102, 104. As with many of the other embodiments described above, the configuration of the module 800 assumes a three-phase wye configuration, although as was set forth above, a three-phase delta configuration is also possible. The module 800 includes relays 110 that switch a load between two phases. Although only one relay 110 is shown in FIG. 10 for simplicity in illustration, as with the embodiments described above, any number of relays 110 may be used such that any load may be connected to any of the phase lines 100, 102, 104.

The module 800 has an output relay 802 in series with the phase-switching input relay 110. The output relay 802 switches its input between the regular load line 804 and a highly capacitive or inductive load 806. The highly inductive or capacitive load 806 may be variable in both load and phase, is connected to the controller 808 by its own control line 816, and would be controlled and selected by the controller 808 as appropriate to shift the waveform in the appropriate direction in order to minimize the potential for arcing in the relay. The highly capacitive or inductive load 806 will typically not be purely inductive or capacitive, but will have sufficient inductance or capacitance to shift the phase of the power meaningfully. For example, a phase shift of 45° is possible. As those of skill in the art will appreciate, the larger the phase shift, the less arcing is likely to occur in the phase-switching input relay 110.

The controller 808 is in communication with the phase-switching input relay 110 and the output relay 802 through respective control lines 810, 812, and also has a control/data line 814 to the ammeters 130 and a control/data line to the ohmmeters 150. Typically, when the controller 808 determines that a phase shift is necessary (e.g., using the methods described above), the characteristics of the highly inductive or capacitive load 806 would first be selected as appropriate, after which the output relay 802 would be switched to the highly capacitive or inductive load 806 before the phase-switching input relay 110 is switched between phase lines 100, 102, 104. Once the switching of the phase-switching input relay 110 is complete, the output relay 802 is actuated again to switch back to the regular load line. The operation may consume no more than a few tens of milliseconds.

Figure 11:
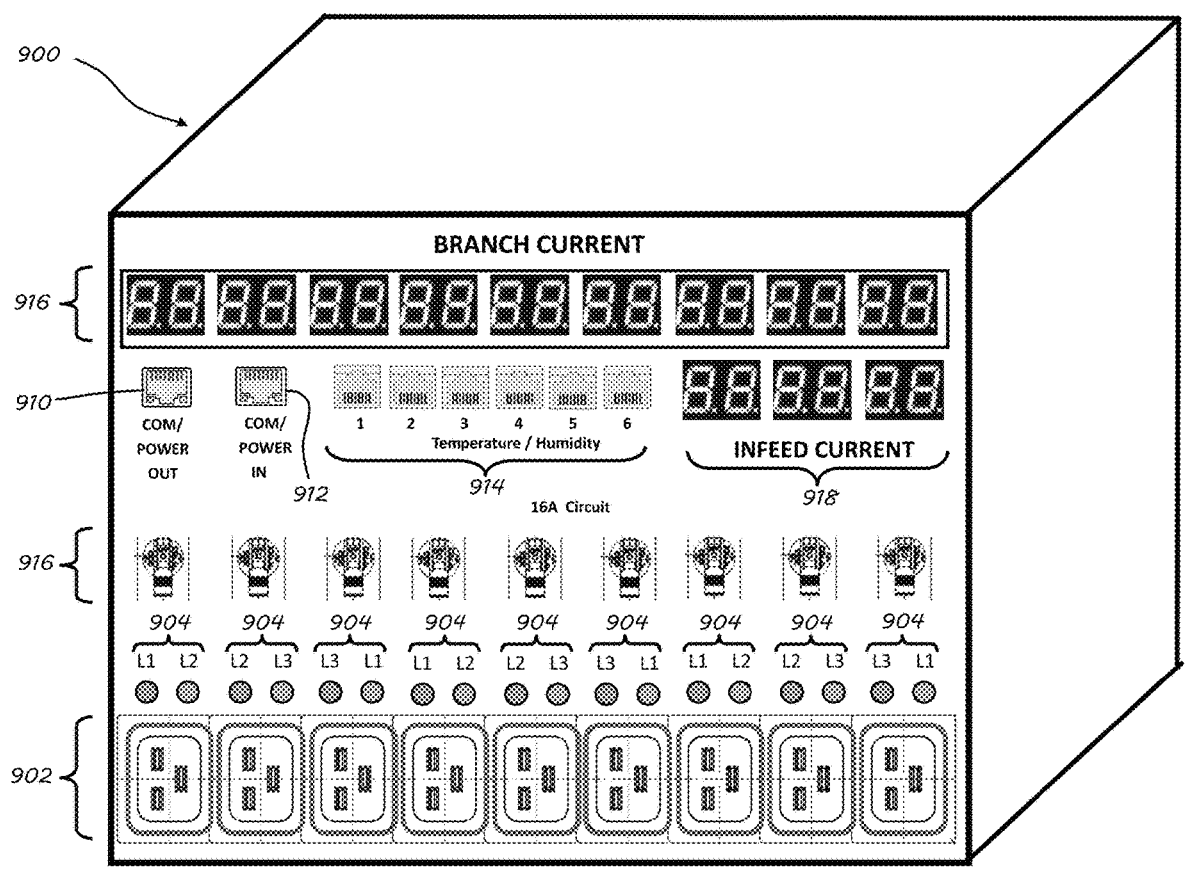
FIG. 11 is an illustration of a power module according to one embodiment of the invention.

FIG. 11 is an illustration of a controller or module 900 according to another embodiment of the invention, particularly illustrating the indicators and controls that may be present. The module 900 of FIG. 11 has a set of power taps or outputs 902 that, in this embodiment, provide a female plug for a standard connecting cable. In this embodiment, there are nine separate power taps 902. Each of the taps 902 is connectable to a different power phase, as described above. Just above the taps 902, sets of indicators 904 indicate which phase-line each tap 902 is currently connected to. In the illustrated embodiment, the indicators 904 are simple LED lights, but other forms of indicator 904 may be used in other embodiments.

This module 900 also includes manually actuatable circuit breakers 906, one corresponding to each of the taps 902. The input current for each of the three phases is displayed in an input current display 908, which in this embodiment, comprises a set of multi-segment LCD numerical displays. A set of output current displays 916 display the output current for each of the taps 902.

The module 900 has communication capabilities, as described above. To that end, a communication output port 910 and a communication input port 912 are present on the module 902. These may be, e.g., traditional RJ45 Ethernet ports, and in addition to communication, they may provide or receive power-over-Ethernet or use other power and data schemes to receive power and instructions. As a final element on the front panel of the illustrated embodiment, the module 900 has a set of temperature/humidity outputs 914. These outputs 914 may also be connected by data connections, such as RJ45 Ethernet ports. Ways in which the module 900 may be powered, and the specific considerations in doing so, will be described below in more detail.

As those of skill in the art will realize, FIG. 11 in essence illustrates the basic functions that the module 900 performs and the information that it receives to perform its functions. The front panel of FIG. 11 is not the only way in which those functions may be performed. For example, input and output currents and indications of which phase each tap 902 is connected to may be shown in a single display, such as an LCD or LED display screen. The form of the module 900 may also differ from embodiment to embodiment. For example, the module 900 may be made in a form suitable for rack mounting, or in any other convenient form for mounting or other kinds of placement. At the rear of the module 900, a terminal block or other such connecting structure would typically be provided to connect to various phases, as is shown schematically in FIGS. 1-3.

Figure 12:
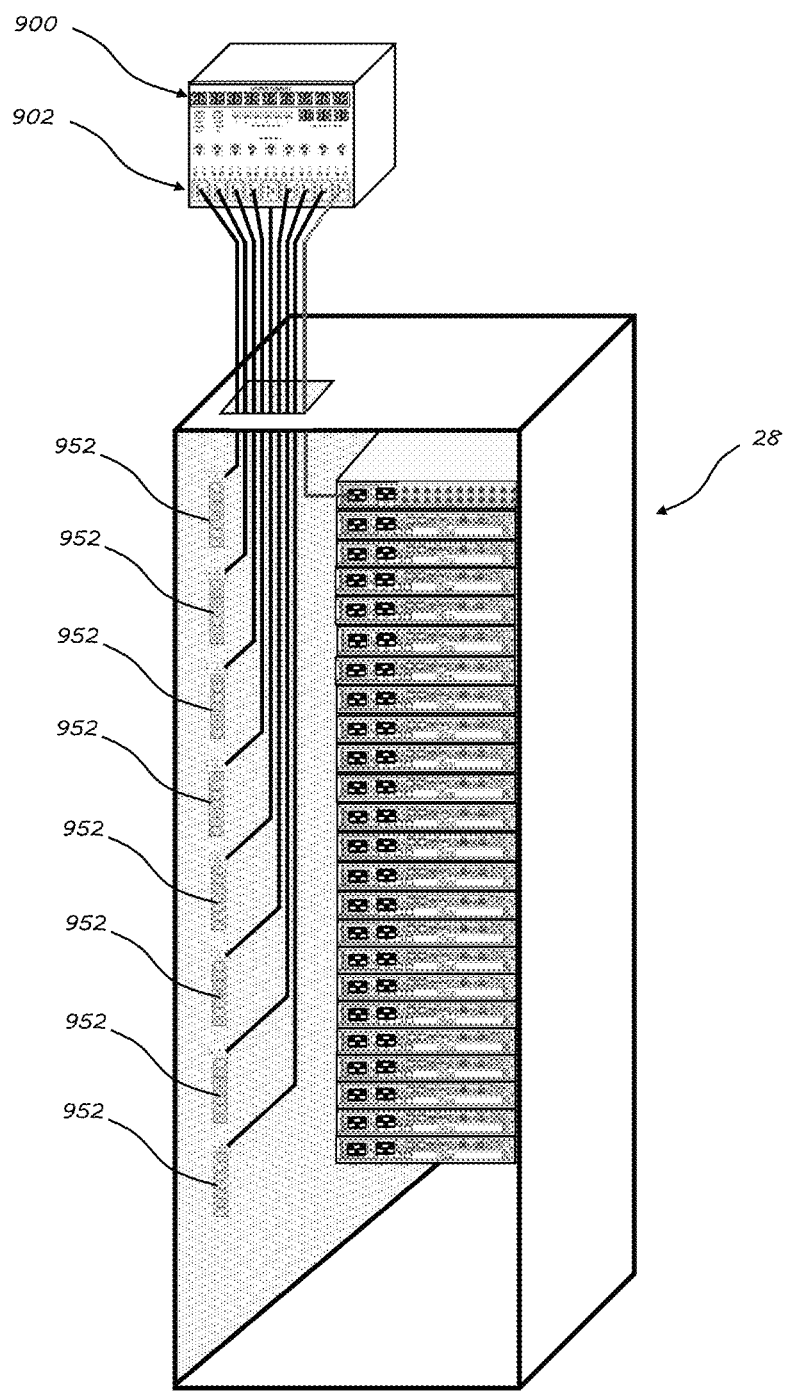
FIG. 12 is an illustration of the power module of FIG. 11 connected so as to power the equipment from a single rack.

As was alluded to above, one of the advantages of modules 900 and power control systems based on them is the range of different, and more flexible, power topologies that they make possible. FIG. 12 shows one of the more basic topologies: a single module 900 powering the equipment in a single rack 28. The rack 28 has nine individual power distribution units (PDUs) 952 Each of the branch PDUs 952 is connected to a separate one of the taps 902. This configuration may provide an electrical load of, e.g., 27.6 kW to rack 28, based on a 240/415V 3 phase system, 16 Amps per branch 902, derated 20%.

Figure 13:
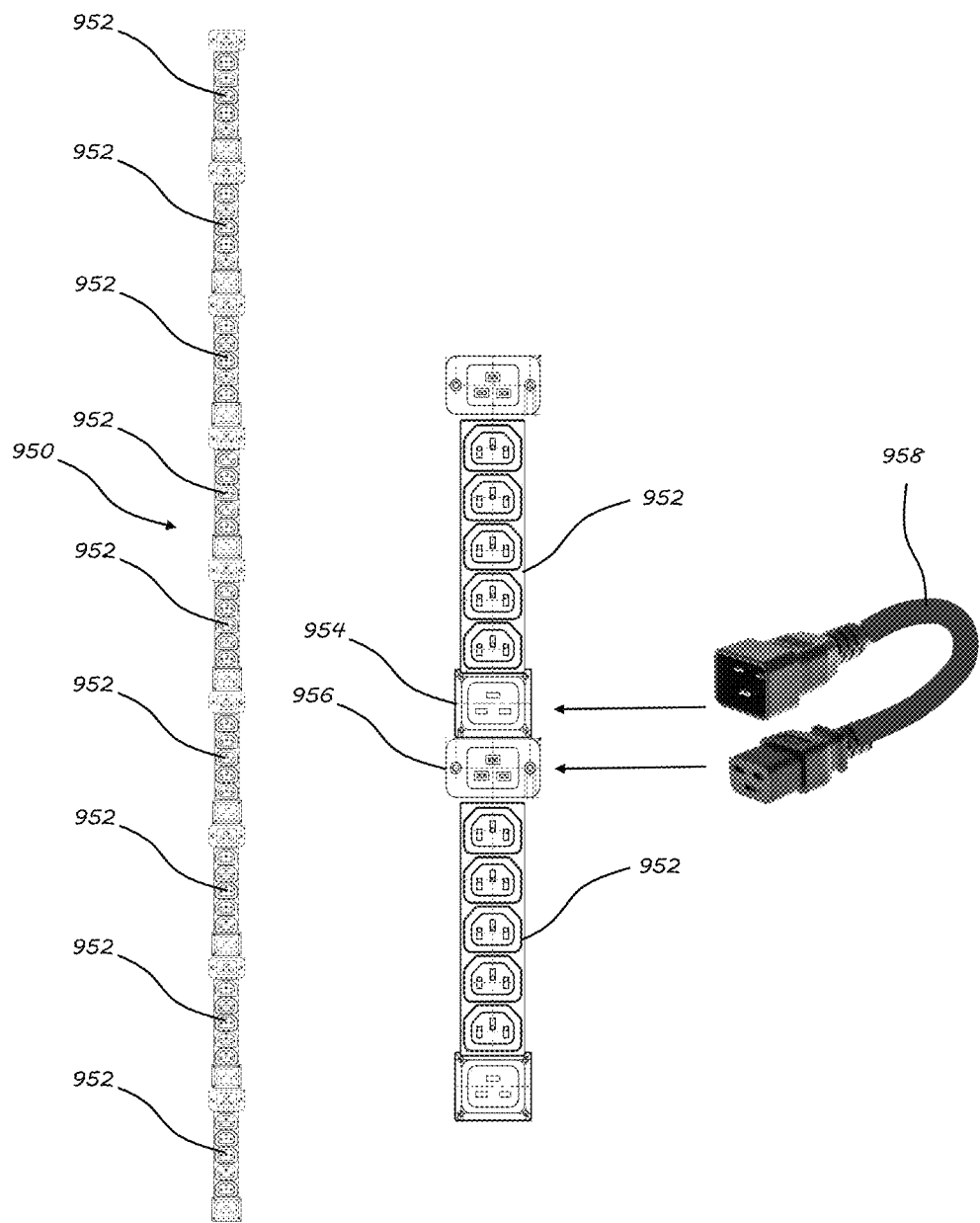
FIG. 13 is an illustration of a power distribution unit in a rack, illustrating how branches of that unit can be jumpered together to configure the loads on the power module.

However, as shown in the view of FIG. 13, which illustrates the PDUs 952 joined into a single PDU 950, in this embodiment, each of the branch PDUs 952 has a power inlet 954 and a power outlet 956. This means that, if desired, branch PDUs 952 can be connected together using a short jumper cable 958, with the power inlet 954 of one PDU branch 952 connected to the power outlet 956 of another PDU branch 952 by the cable 958

This arrangement has a particular advantage: the number of outlets per branch 902 can be increased or decreased as needed based on the power usage of each piece of connected equipment such that an optimum load level is achieved (e.g. 40% of branch rating) which also facilitates load balancing in a manual fashion.

Figure 14:
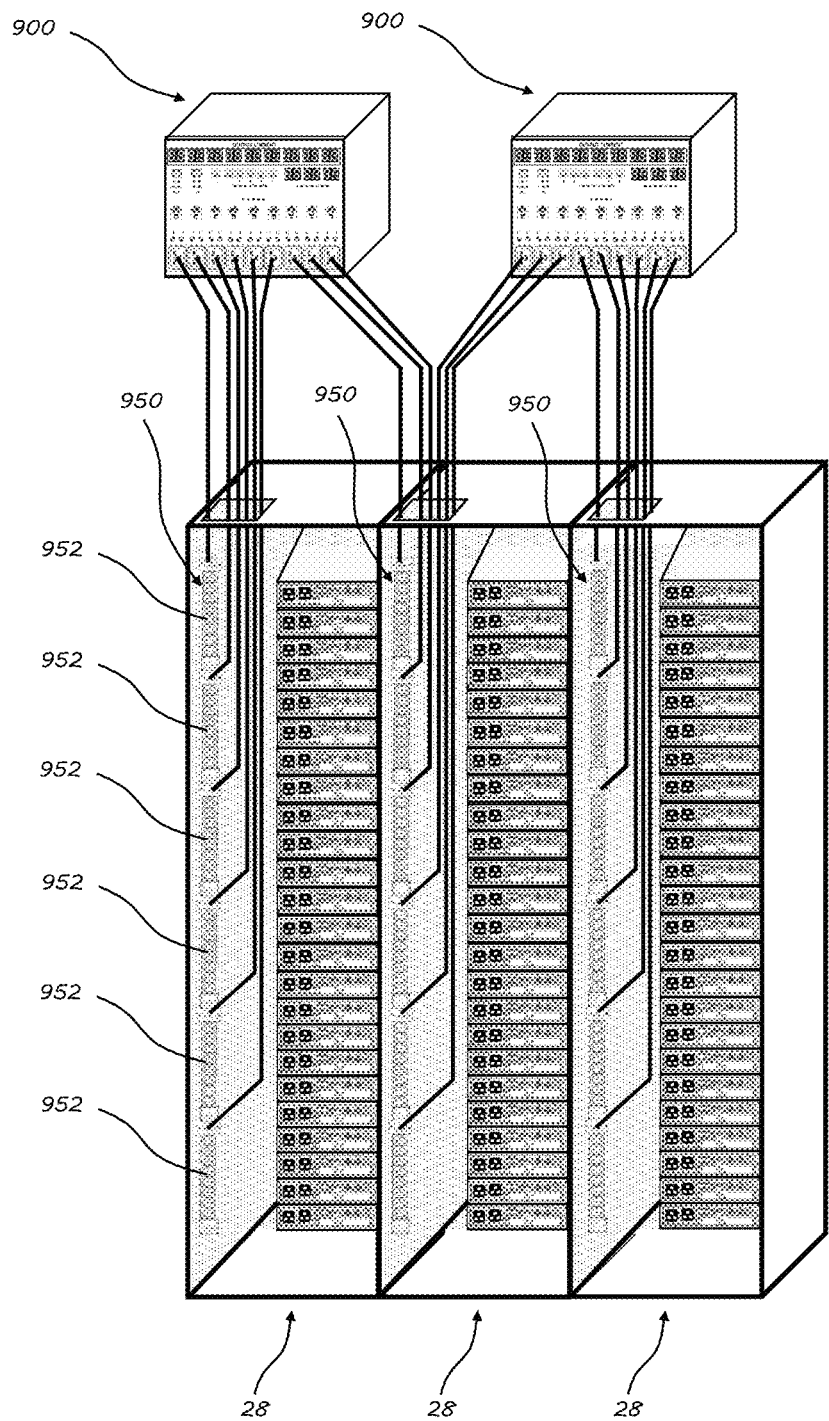
FIG. 14 is an illustration showing two power modules of FIG. 11 powering the equipment in three separate racks.

While a single module 900 powering the equipment in a single rack 28 is perhaps the most straightforward application of a module 900, it is by far not the only way in which a module 900 may be put to use. FIG. 14 is an illustration of an embodiment in which two modules 900 are used to power the equipment in three racks 28. Each module 900 powers all of the branch PDUs 952 in a single rack 28. Since each of the PDUs 950 in the racks 28 have six branches 952, that leaves three taps 902 unused in each module 900. Thus, three taps 902 in each of the two modules 900 are used to power the PDU 950 in the third rack 28, depicted as the center rack in FIG. 14. The three racks 28 may provide an electrical load of, e.g., 18.4 kW per rack 28, based on a 240/415V 3 phase system, 16 Amps per branch 902, derated 20%.

There are several advantages to this sort of arrangement. First, since there are fewer modules 900 than there are racks 28, the arrangement is more economical in terms of equipment. Additionally, there is an element of redundancy, especially with respect to the center rack 28 of FIG. 14, which is powered by both modules 900. Should one of the modules 900 fail, only some of the branch PDUs 952 in the center rack 28 will lose power.

Figure 15:
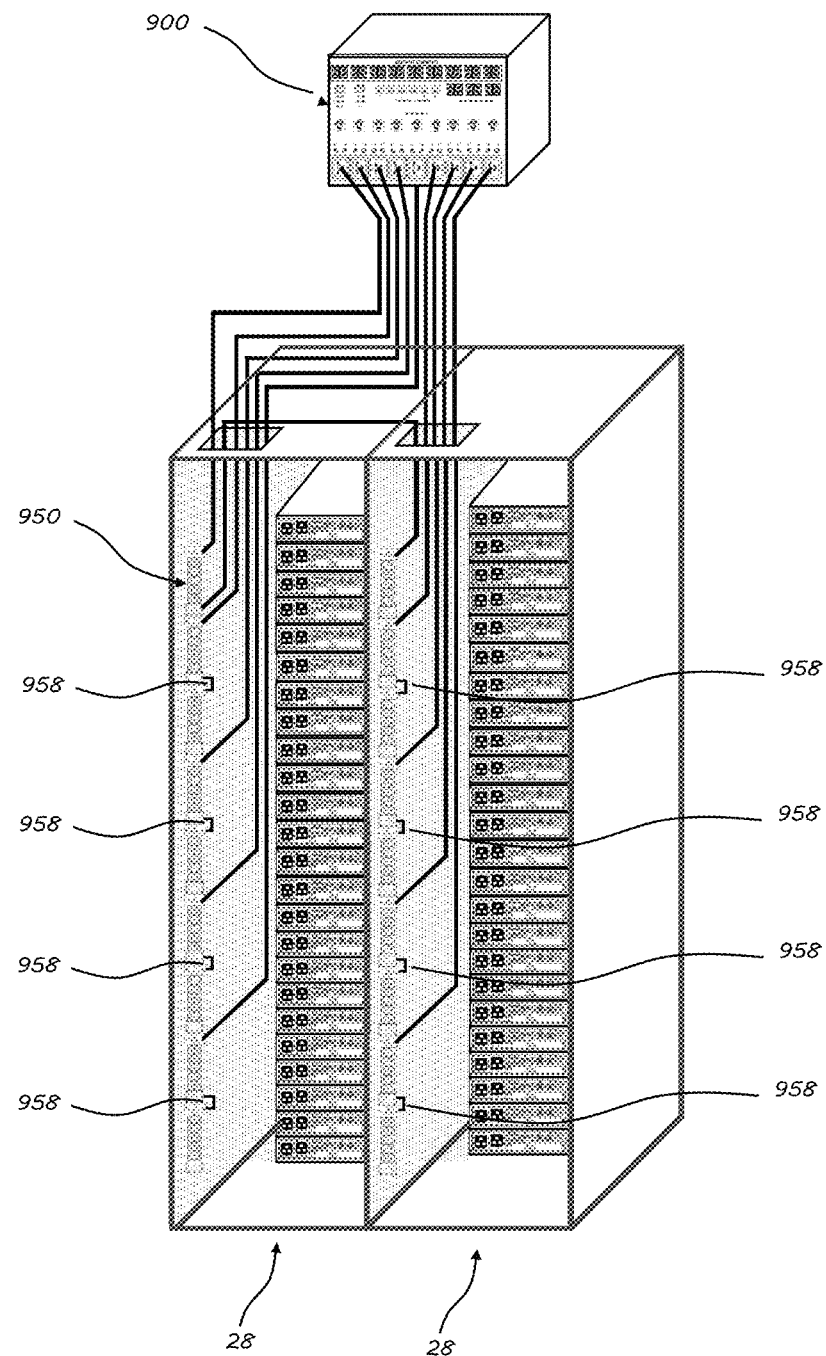
FIG. 15 is an illustration showing one power module of FIG. 11 powering the equipment in two separate racks.

In FIG. 14, each branch PDU 952 is powered by a separate tap 902 of a module 900. However, for the reasons described above, that need not be the case in all embodiments. Instead, depending on the sizes of the loads, branch PDUs 952 could be connected together, such that several branch PDUs 952 could be served by a single tap 902. If this is done, as shown in FIG. 15 were two branches 952 of PDUs 950 are joined with jumper cables 958a single module 900 may power two racks 28 while using the same PDU 950. In this case, each rack 28 may have a load of, e.g., 13.8 kW, based on a 240/415V 3 phase system, 16 Amps per branch 902, derated 20%.

Figure 16:
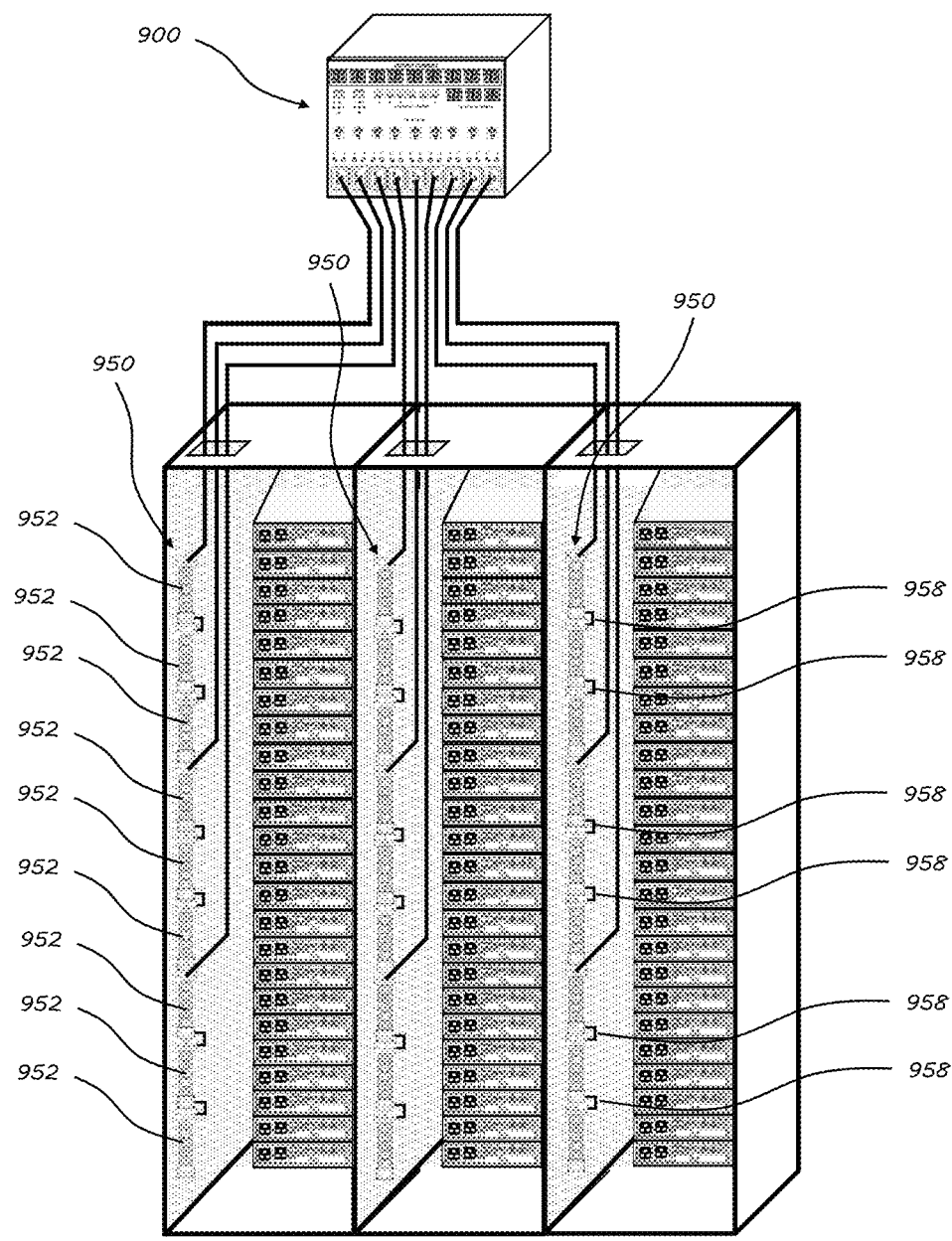
FIG. 16 is an illustration showing one power module of FIG. 11 powering the equipment in three separate racks.

Finally, in FIG. 16, an embodiment is shown in which three taps 902 from one module 900 each go to three separate racks 28, such that the module 900 powers all three racks 28. Each rack 28 may have a load of, e.g., 9.2 kW per rack 28 based on a 240/415V 3 phase system, 16 Amps per branch 902, derated 20%

In order to allow the entire rack 28 to be powered from three taps 902, a significant number of the PDU branches 952 are interconnected with jumpers 958, as described above.

As can be appreciated, the power requirements per rack are highly variable within the data center, and evolve over time. Once the loads are configured by jumpering together PDU branches 952, the modules 900 can dynamically select phases for the loads to balance the loads across the three phases. Additionally, if the power delivery is to be increased, all a data center manager need do is configure the PDUs 950 and install more modules 900. Demonstrated here is the ability to provide four different power densities ranging from 9.2 kW per rack to 27.6 kW per rack with the same set modules 900, PDUs 950, and jumpers 958. Current state of the art would require four different modules, and four different PDU's to achieve this scalability.

As was described briefly above, scalablity, redundancy and fault tolerance are particular advantages of the invention. For purposes of redundancy and fault tolerance, it may be helpful to consider how the individual modules 900 are powered. For example, it is perfectly possible to include an AC to DC power supply, such as a switched-mode power supply, in each module 900 to power its internal circuits. In that case, the module 900 would simply draw power from the same mains that supply the taps 902. This has the advantage that as long as the mains have power, the modules 900 will have power.

However, directly powering the modules 900 from electrical mains with internal power supplies may not be the best solution in practice. The module 900 operates with high voltage and may operate at internal temperatures upwards of 80° C. Because of the relatively high temperature, an AC to DC power supply within the module 900 would likely have a relatively short mean time between failures (MTBF). To accommodate relatively frequent failures, it would be advisable to have two or more power supplies within the modules 900 and to make those power supplies "hot swappable," i.e., easily replaced in operation. All of this adds to the size, complexity and cost of the module 900 and detracts from its overall reliability.

For these reasons, it may be more advantageous to power the internal logic circuits of the modules 900 from a remote source. One particularly convenient way in which to do this is to use a traditional rack-mount server as the source of DC power for modules 900. Typical rack mount servers in data centers have redundant, hot-swappable DC power supplies that can be used to supply redundant power for modules 900, as well as redundant communication interfaces and other components that are already designed for use in a data center environment. The power supplies in servers can be specified with excess capacity such that many tens of modules can be powered from a single server.

Figure 17:
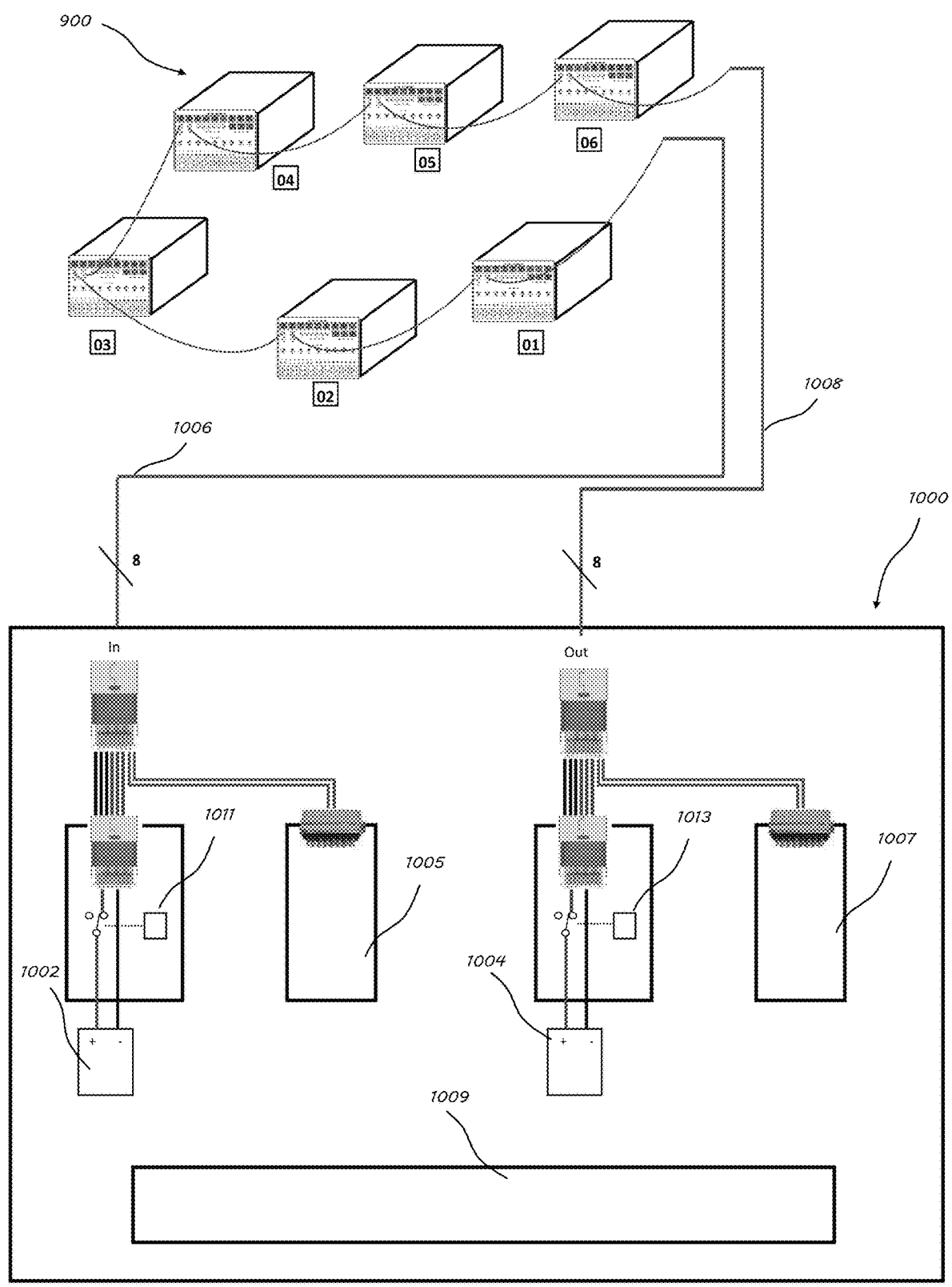
FIG. 17 is an illustration showing a number of power modules connected together to receive power and control signals from a controller or coordinating computer.

FIG. 17 is a schematic illustration of the manner in which several modules 900 may be connected with a coordinating computer 1000, which may be a typical server computer mounted in a rack 28. The coordinating computer 1000 has two power supplies 1002, 1004. These power supplies 1002, 1004 are redundant and "hot swappable," i.e., if one fails, the other one is able to supply all power needed by the controlling computer 100 and the modules 900, and they are easily replaced during operation without requiring a power down of the server. In the illustrated embodiment, each of the power supplies 1002, 1004 is capable of supplying, e.g., 1,100 W of power at 48-56 VDC, although that may vary from embodiment to embodiment.

In addition to one or more processors, memory, and other such typical computing equipment, generally indicated at 1009, the coordinating computer 1000 includes two input-output interfaces 1005 and 1007 thus providing communication redundancy to the modules; specifically, two complete sets of input-output circuits, each capable of connecting to modules 900. In FIG. 17, several modules 900 are connected to the input-output interfaces 1005 and 1007 of the coordinating computer 1000 in a ring configuration. The modules 900 of FIG. 17 might represent, e.g., the modules 900 powering a single row of racks 28 in a data center, although a single coordinating computer 1000 may power and control several rows of modules 900, subject only to the power limitations of the power supplies 1002, 1004 in coordination with the power requirements of the modules.

The connecting cables 1006, 1008 may carry both data and power signals, or separate power and data cables may be used in some embodiments. The protocol and infrastructure used to do so may vary from embodiment to embodiment and may be any suitable protocol. Power-over-Ethernet is but one example of a protocol and infrastructure that can be used to convey both power and data but is by no means the only protocol that may be used. As another example, the coordinating computer 1000 may be connected to the modules 900 with CAT5 or CAT6 Ethernet cables 1006, 1008. Three of the four twisted pairs in the cables 1006, 1008 may be used to transmit power, while the remaining pair of conductors is used to convey data signals in, e.g., the serial communication protocol. Within the coordinating computer 1000, the interfaces 1005 and 1007 may comprise, e.g., PCI express (PCIe) to serial interface cards.

With the configuration shown in FIG. 17, power is fed in both directions. Therefore, if there is a break in one of the cables 1006, 1008, all of the modules 900 will still be powered because power is fed in both directions. Similarly, data can be transmitted in both directions as well, so a break in one of the cables 1006, 1008 will not necessarily lead to a communication failure. As those of skill in the art will note, because the taps 902 in each module 900 are powered separately from its logic circuits, an unexpected loss of power in the logic circuits of a module 900 (e.g., caused by a failure of one of the cables 1006, or a loss of one of the power supplies 1002, 1004) will not necessarily result in the loss of power to the equipment, although the ability to monitor and dynamically switch equipment between phases may be lost until power to the logic circuits of the module 900 is restored. In the event that a module 900 stops communicating due to a software glitch, often referred to a lock up or freeze, the controlling computer 1000 can cycle DC power from the ring via relays 1011 and 1013, essentially rebooting the microcontrollers in modules 900.

As shown, the coordinating computer 1000 is provided with several redundant communications interface devices, such that the failure of one will not necessarily result in the failure of the entire system. Each module 900 may be connected to more than one input and more than one output for the sake of redundancy.

In all of these ways, the system provides redundancy. As was described above, the connections between the coordinating computer 1000 and modules 900 are such that a single break in the cabling 1006, 1008 will not impair performance, because power and data are sent redundantly in both directions. The modules 900 of this embodiment use externally-delivered power, which, for the reasons explained above, may be more reliable than the typical arrangement of having an onboard power supply. Multiple failures in the cabling 1006, 1008, which may result in a loss of power to the onboard logic and control circuits within the modules 900, will not necessarily or automatically result in a loss of high-voltage AC power to the taps 902 and the equipment that they power. Moreover, the coordinating computer 1000 itself would typically be an off-the-shelf server, or a simple modification of such a server, which would offer modular, replaceable power supplies and other such components.

In most cases, commands from the coordinating computer 1000 will be broadcast to each of the modules 900 and the appropriate module 900 will respond to the commands. This may allow for the fastest communication between the modules 900 and the coordinating computer. However, there are instances in which the modules 900 may be instructed to enter a communication relay mode, in which the communication is sent to the first module 900 in the ring or series, and that module 900 relays the communication to the next module 900, which relays it to the next module 900, etc. Relay-mode communication may be used, for example, on initial deployment and/or system power-on to provide each module 900 with a unique address representing the physical position of the module in the ring with respect to other modules, or when modules 900 are added or removed from the ring. Relay-mode communication may also be used for diagnostic purposes, e.g., to ensure that the connections have no breaks in them, and that all modules 900 are operating properly.

Figure 18:
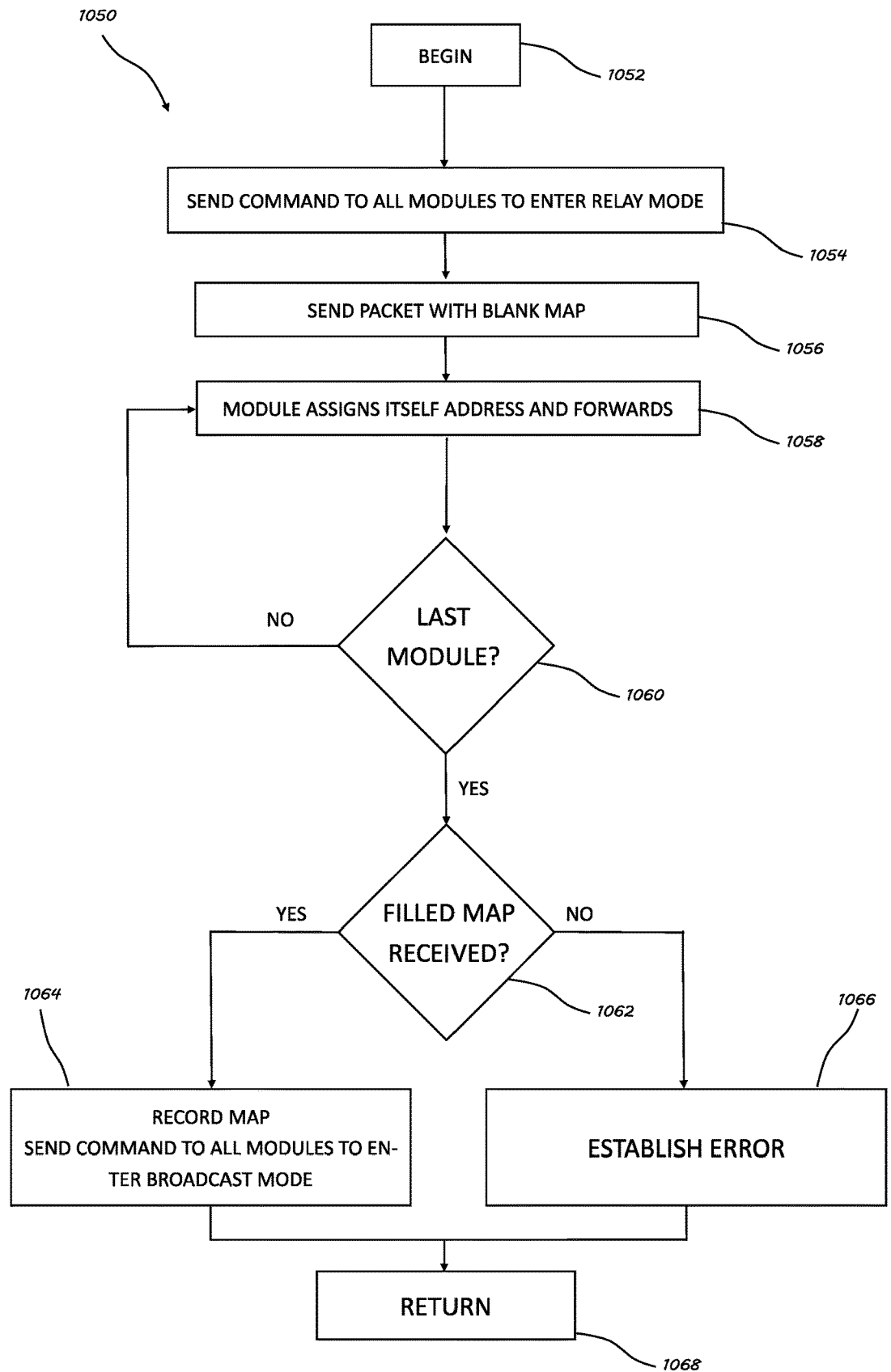
FIG. 18 is a schematic flow diagram of a method for automatically creating a map of the physical topology of a set of power modules.

FIG. 18 is a schematic flow diagram of a method, generally indicated at 1050, for operating the modules 900 in relay mode. Method 1050 begins at task 1052 and continues at task 1054. In task 1054, the coordinating computer sends a command to all modules in the ring to enter relay mode. In task 1056, 1000 sends out a data packet with a blank map to the first module 900 in the ring through the out communication port. Since all modules 900 are in relay mode, the only module 900 capable of receiving the packet is the module 900 directly connected to 1000. Method 1050 continues with task 1058 as the first module 900 receives the data packet, fills in a designator in the first open location in the map, and then forwards the data packet with the altered map to the next module 900 in the ring, which similarly fills in a designator in the next-available location on the map. This continues, with each module 900 filling in its designator on the map, until the last module 900 is reached, as shown in task 1060, and the data packet with the filled-in map is returned to the coordinating computer 1000. If the filled-in map is received (task 1062:YES), the map is recorded by the coordinating computer 1000 in task 1064. If a data packet with the filled-in map is not received after a predefined interval (task 1062:NO), control of method 1050 passes to task 1066 and an error is established and reported via a user interface. Method 1050 returns at task 1068. When method 1050 returns, the coordinating computer 1000 may broadcast an instruction to return to broadcast-communication mode or, if an error was detected, take certain predefined steps to manage the error and maintain the functionality of the remaining modules 900 until the error is addressed.

As those of skill in the art will realize, method 1050 of FIG. 18 offers an automated way to build a map of the physical topology of the power supply system. This is in contrast to many methods traditionally used with servers, which require the manual identification of the physical location of networked components.

While the invention has been described with respect to certain embodiments, the description is intended to be exemplary, rather than limiting. Modifications and changes may be made within the scope of the invention, which is defined by the appended claims.

What is claimed is:

1. A system comprising:
   one or more modules, each module including
   an internal power distribution bus adapted to be connected to a plurality of power phases,
   one or more power taps,
   one or more switching elements connected between the internal power distribution bus and the one or more power taps, the one or more switching elements adapted to allow the one or more power taps to be independently connected to any of the plurality of power phases, and
   logic and control circuits adapted to control at least the one or more switching elements;
   an external power supply adapted to supply power to the logic and control circuits of the one or more modules separately from the internal power distribution buses of the one or more modules; and an external controller in communication with the one or more modules to convey instructions to the logic and control circuits of the one or more modules.

2. The system of claim 1, wherein the one or more switching elements of the one or more modules are all two-to-one switching elements.

3. The system of claim 1, further comprising a coordinating computer that includes the external power supply and the external controller.

4. The system of claim 3, wherein the external power supply of the coordinating computer supplies direct current (DC) power.

5. The system of claim 4, wherein the external power supply comprises a first power supply and a second power supply, both installed within, or in association with, the coordinating computer, such that the first power supply and the second power supply can each individually and redundantly supply sufficient power to the logic and control circuits of the one or more modules.

6. The system of claim 5, wherein the one or more modules are connected with the coordinating computer in a ring, and the first power supply and the second power supply send power in first and second directions, different from one another, along the ring.

7. The system of claim 6, wherein the external controller sends instructions in both of the first and second directions.

8. The system of claim 1, wherein an interruption in the power supplied by the external power supply to the logic and control circuits does not interrupt the power supplied to the one or more taps.

9. A method, comprising:
using a coordinating computer, sending a data packet containing an initially blank topological map to a plurality of power modules physically connected in a ring configuration, each of the plurality of power modules connected to a set of power mains and adapted to switch loads between power phase lines of the set of power mains in order to achieve a phase balance;
causing or allowing each of the plurality of power modules, in succession, to add identifying information to the topological map to complete the topological map; and
addressing a command to one of the plurality of power modules to switch one of the loads between the power phase lines using the identifying information provided by the topological map.

10. The method of claim 9, further comprising detecting a break in the ring configuration based on non-return of the data packet to the coordinating computer within a defined time.

11. The method of claim 9, further comprising repeating said sending periodically.

12. A system, comprising:
one or more modules, each module including
an internal power distribution bus adapted to be connected to a plurality of power phases,
one or more power taps,
one or more switching elements connected between the internal power distribution bus and the one or more power taps, the one or more switching elements adapted to allow the one or more power taps to be independently connected to any of the plurality of power phases, and
logic and control circuits adapted to control at least the one or more switching elements;
an external power supply adapted to supply power to the logic and control circuits of the one or more modules separately from the internal power distribution buses of the one or more modules;
an external controller in communication with the one or more modules to convey instructions to the logic and control circuits of the one or more modules; and
one or more equipment racks, each of the one or more equipment racks having a power distribution unit with one or more branches, the one or more branches of the power distribution unit connected to one or more of the one or more power taps.

13. The system of claim 12, wherein ones of the one or more branches of the power distribution unit are connected together and draw power from a single one of the one or more power taps.

* * * * *